United States Patent [19]

Barzilai et al.

[11] Patent Number: 4,763,289
[45] Date of Patent: Aug. 9, 1988

[54] METHOD FOR THE MODELING AND FAULT SIMULATION OF COMPLEMENTARY METAL OXIDE SEMICONDUCTOR CIRCUITS

[75] Inventors: Zeev Barzilai, Millwood; Vijay S. Iyengar, Peekskill; Barry K. Rosen, Stormville, all of N.Y.; Gabriel M. Silberman, Haifa, Israel

[73] Assignee: International Business Machines Corporation, Armonk, N.Y.

[21] Appl. No.: 815,435

[22] Filed: Dec. 31, 1985

[51] Int. Cl.⁴ .................. G06F 15/20; G06F 11/22
[52] U.S. Cl. ............................ 364/578; 364/200; 371/23
[58] Field of Search ............ 364/200, 300, 900, 578; 371/23

[56] References Cited

U.S. PATENT DOCUMENTS

| | | |
|---|---|---|
| 3,633,100 | 1/1972 | Heilwell et al. |
| 3,715,573 | 2/1973 | Vogelsberg ............................ 371/23 |
| 3,775,598 | 11/1973 | Chao et al. |
| 4,204,633 | 5/1980 | Goel .................................. 371/23 X |
| 4,306,286 | 12/1981 | Cocke et al. ........................ 364/200 |
| 4,308,616 | 12/1981 | Timoc ................................... 371/23 |
| 4,527,249 | 7/1985 | Van Brunt ........................... 364/578 |

OTHER PUBLICATIONS

Whitney: Algebraic Fault Analysis for Constrained pp. 141-145, Combinatorial Networks, *IEEE Trans. on Computers*, vol. 20, No. 2, Feb. 1971.

Szygenda et al: Modeling and Digital Simulation for Design Verification and Diagnosis, IEEE Transactions on Computers, pp. 1242-1252, vol. C25, No. 12, Dec. 1976.

Beaven et al: Simulation and Testing of Three-State Logic, pp. 1662-1663, Circuitry *IBM Technical Discl. Bull.*, vol. 21, No. 4, Sept. 1978.

"A System Engineer's Guide to Simulators", by Werner et al, VLSI Design, Feb. 1984, pp. 27-31.

"Cascode Voltage Switch Logic Family", Heller et al, Proc. IEEE International Solid-State Circuits Conf., Feb. 22-24, 1984, San Francisco, CA.

D. A. Huffman, "The Design and Use of Hazard-Free Switching Networks," *J.ACM*, vol. 4, pp. 47-62, Jan. 1957.

E. B. Eichelberger, "Hazard Detection in Combinational and Sequential Switching Circuits," *IBM Journal of Research and Development*, Mar. 1965, pp. 90-99.

E. J. McCluskey, *Introduction to the Theory of Switching Circuits*, McGraw-Hill Book Company, 1965.

A. D. Friedman and P. R. Menon, *Theory and Design of Switching Circuits*, Computer Science Press, Inc. 1975.

Al-Arian, S. A. and Agrawal, D. P.: "Modeling and Testing of CMOS Circuits," *Proceedings of* 1984 *ICCD Conference* (Oct. 1976), 763-769.

Hlavicka, J., and Kottek, E.: "Fault Model for TTL Circuits," *Digital Processes*, 2(1976), 169-180.

Goel, P.: "Lookahead Technique for Speeding Up Fault Simulation for LSSD Logic Networks," *IBM Technical Disclosure Bulletin*, vol. 21, No. 4 (Sep. 1978), 1449-1450.

(List continued on next page.)

*Primary Examiner*—Felix D. Gruber
*Attorney, Agent, or Firm*—Roy R. Schlemmer

[57] ABSTRACT

A method for modeling complementary metal oxide semiconductor (CMOS) combinatorial logic circuits by Boolean gates taking into account circuit behavior effects due to charge storing and static hazards. Models are developed for both the faultless and faulty operation of each circuit. According to a further aspect of the invention, these models are used in a simulation procedure to evaluate the fault coverage of a large scale integrated circuit design built using a plurality of these circuits. In the evaluation procedure the faulty model is used only for a particular circuit whose failure performance is being tested and the faultless model is utilized for all other circuits. This procedure is continued until all of the individual gate circuits have been evaluated.

6 Claims, 8 Drawing Sheets

OTHER PUBLICATIONS

Cesar, C. L., Cha, C. W., and Donath, W. E.: "Simultaneous Unit- and Zero-Delay-Mode Fault Simultion to Provide Decreasing Redundant Simulation of Gates in Arbitrary Sequential Circuits Fault Simulation," *IBM Technical Disclosure Bulletin*, vol. 21, No. 10 (Mar. 1979).

C. Mead and L. Conway, *Introduction to VLSI Systems*, Addison Wesley, 1980.

Y. M. El-Ziq, "Automatic Test Generation for Stuck Open Faults in CMOS VLSI," *Proc. ACM 18th Design Automation Conference*, Jun. 1981, pp. 347–354.

Bryant, R. E., and Schuster, M. D.: "Fault Simulation of MOS Digital Circuits," *VLSI Designs*, vol. 4, No. 6 (Oct. 1983), 24–30.

K. W. Chiang and Z. G. Vranesic, "On Fault Detection in CMOS Logic Networks," *Proc. ACM IEEE 20th Design Automation Conference*, Jun. 1983, pp. 50–56.

A. Gupta, "ACE: A Circuit Extractor," Proc. of 20th Design Automation Conference, 1983.

S. K. Jain and V. D. Agrawal, "Test Generation for MOS Circuits Using D-Algorithm," *Proc. ACM IEEE 20th Design Automation Conference*, Jun. 1983, pp. 64–70.

S. M. Reddy, M. K. Reddy and J. G. Kuhl, "On Testable Design for CMOS Logic Circuits," *Proc. Internat. Test Conf.* 1983 (Oct. 1983), pp. 435–445.

M. Trick, A. J. Strojwas, and S. W. Director, "Fast RC Simulation for VLSI Interconnect," IEEE International Conference on Computer-Aided Design, 1983, pp. 178–179.

S. H. Unger, *Asynchronous Sequential Switching Circuits*, Robert E. Krieger Publishing Company, 1983 (reprint).

S. M. Reddy, M. K. Reddy and V. D. Agrawal, "Robust Tests for Stuck-Open Faults in CMOS Combinational Logic Circuits," *Proc. Fourteenth International Fault-Tolerant Computing Symposium*, Jun. 1984, pp. 44–49.

S. M. Reddy, V. D. Agrawal and S. K. Jain, "A Gate Level Model for CMOS Combinational Logic Circuits," *Proc. ACM IEEE 21st Design Automation Conference*, Jun. 1984, pp. 504–509.

Jain, S. K., and Agrawal, V. D.: "Modeling and Test Generation Algorithms for MOS Circuits," *IEEE Transactions on Computers*, vol. C-34, No. 5 (May 1985), 426–433.

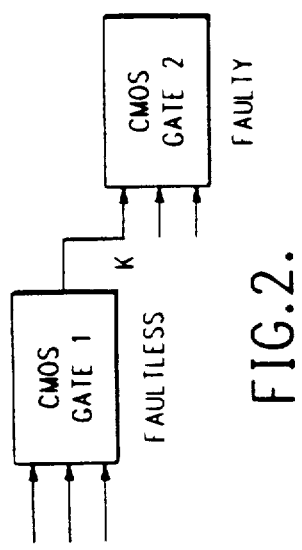
FIG.1
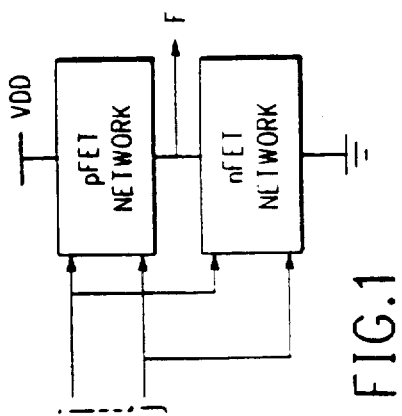
FIG.3.1
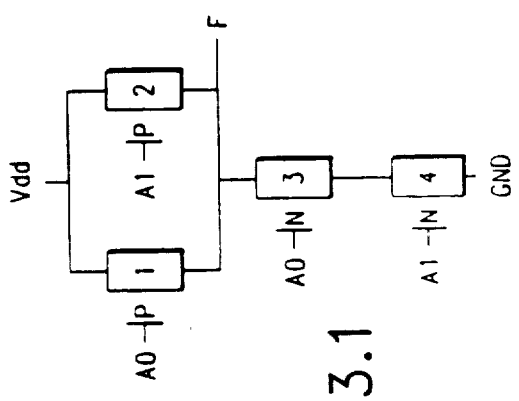
FIG.2.
FIG.3.2 nFET CONTACT NETWORK
FIG.3.3 pFET CONTACT NETWORK
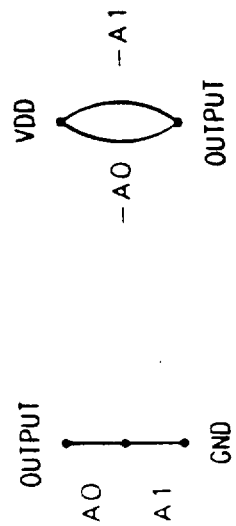

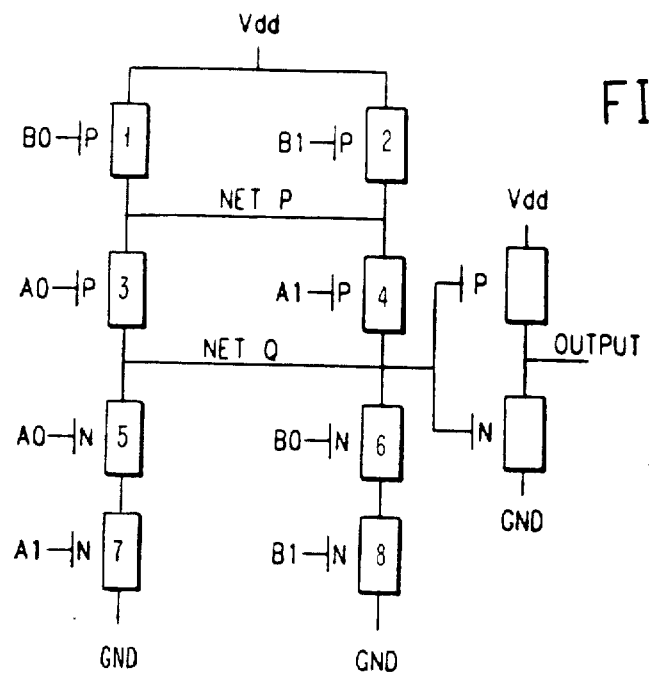
FIG.4
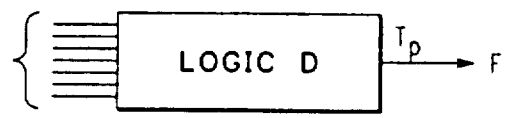
FIG.5.1
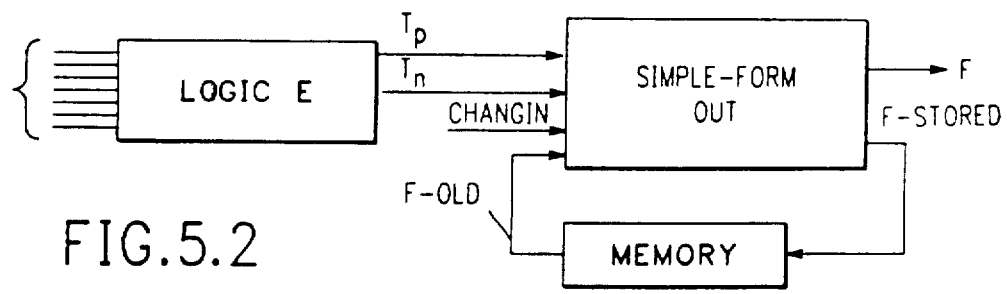
FIG.5.2

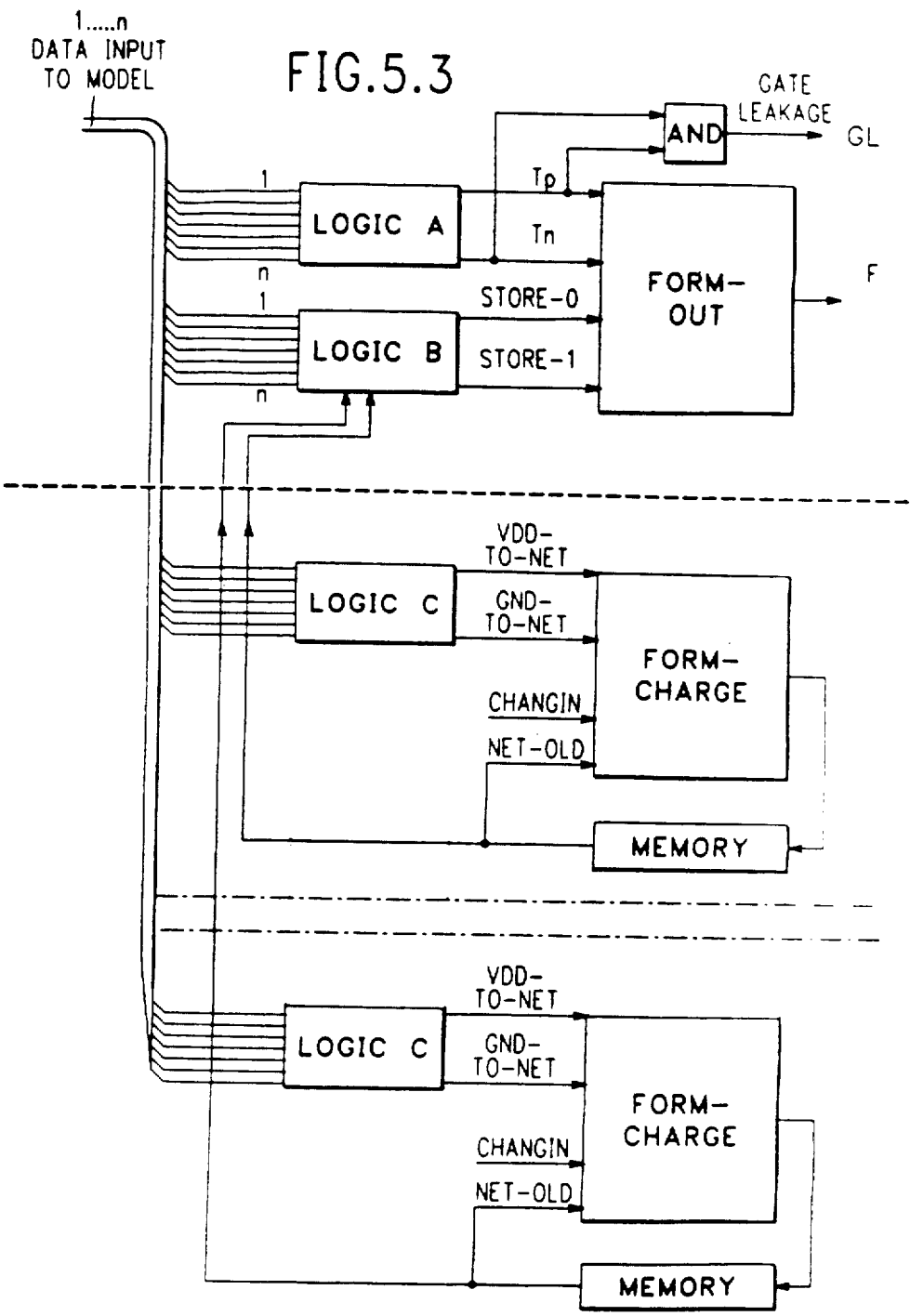
FIG.5.3

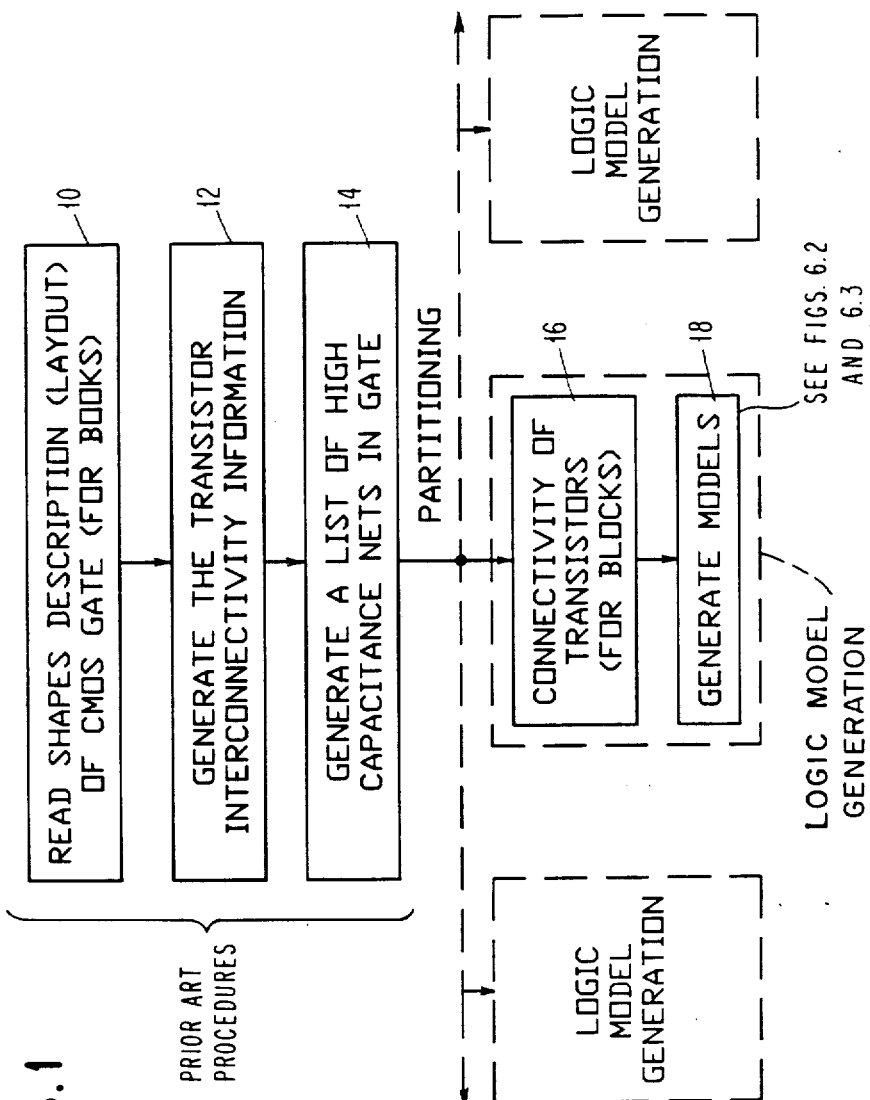
FIG. 6.1

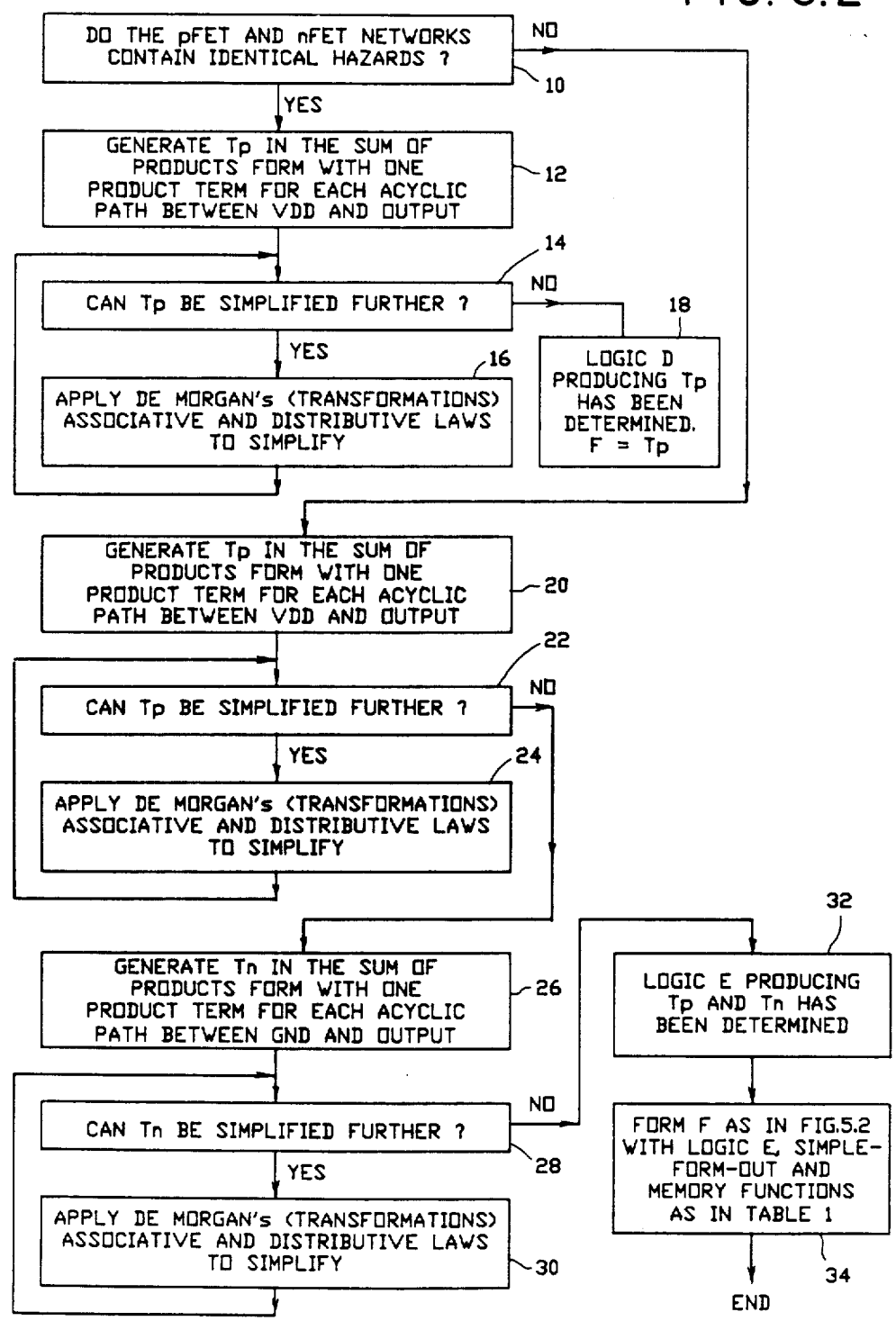
FIG. 6.2

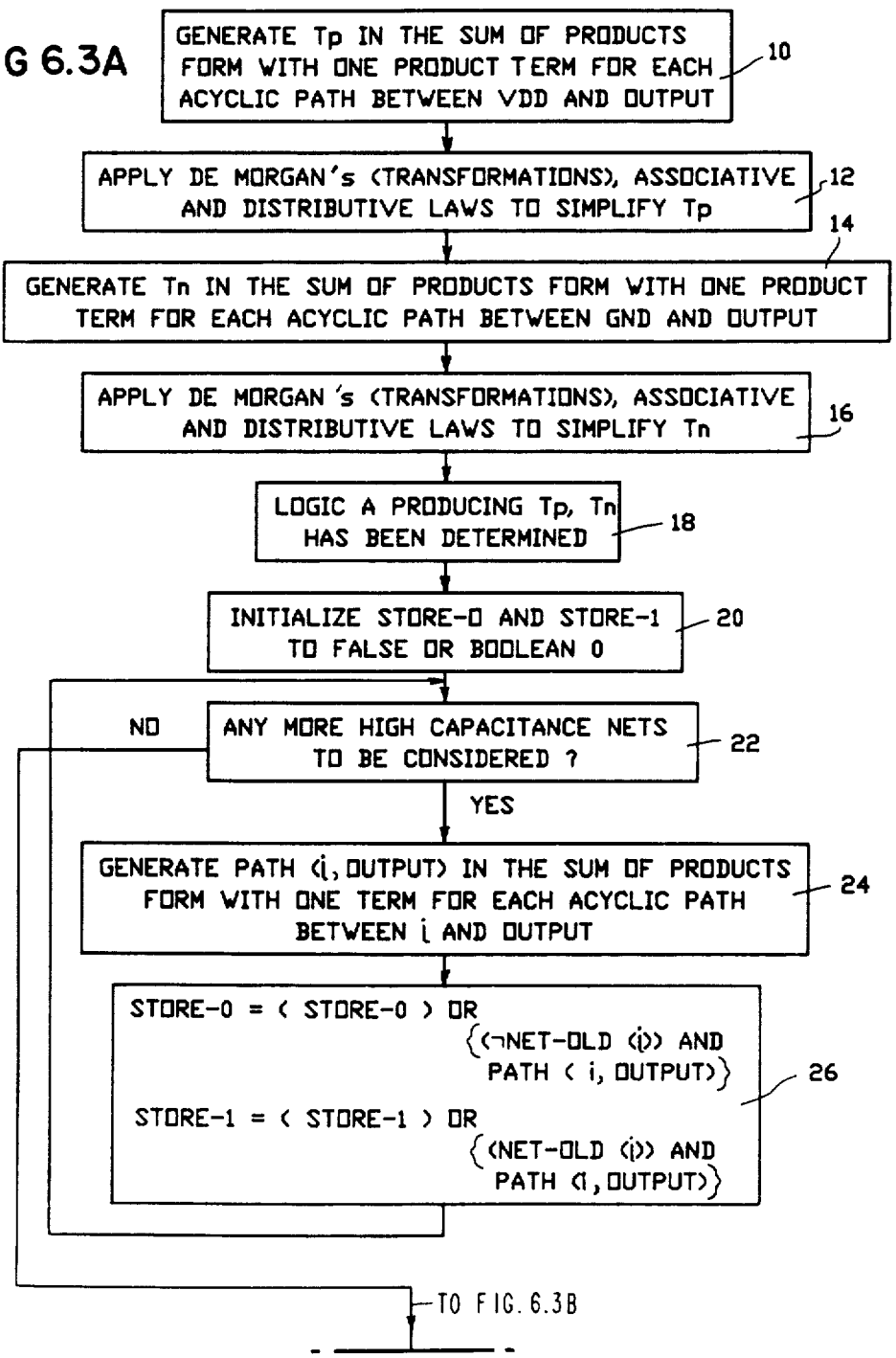

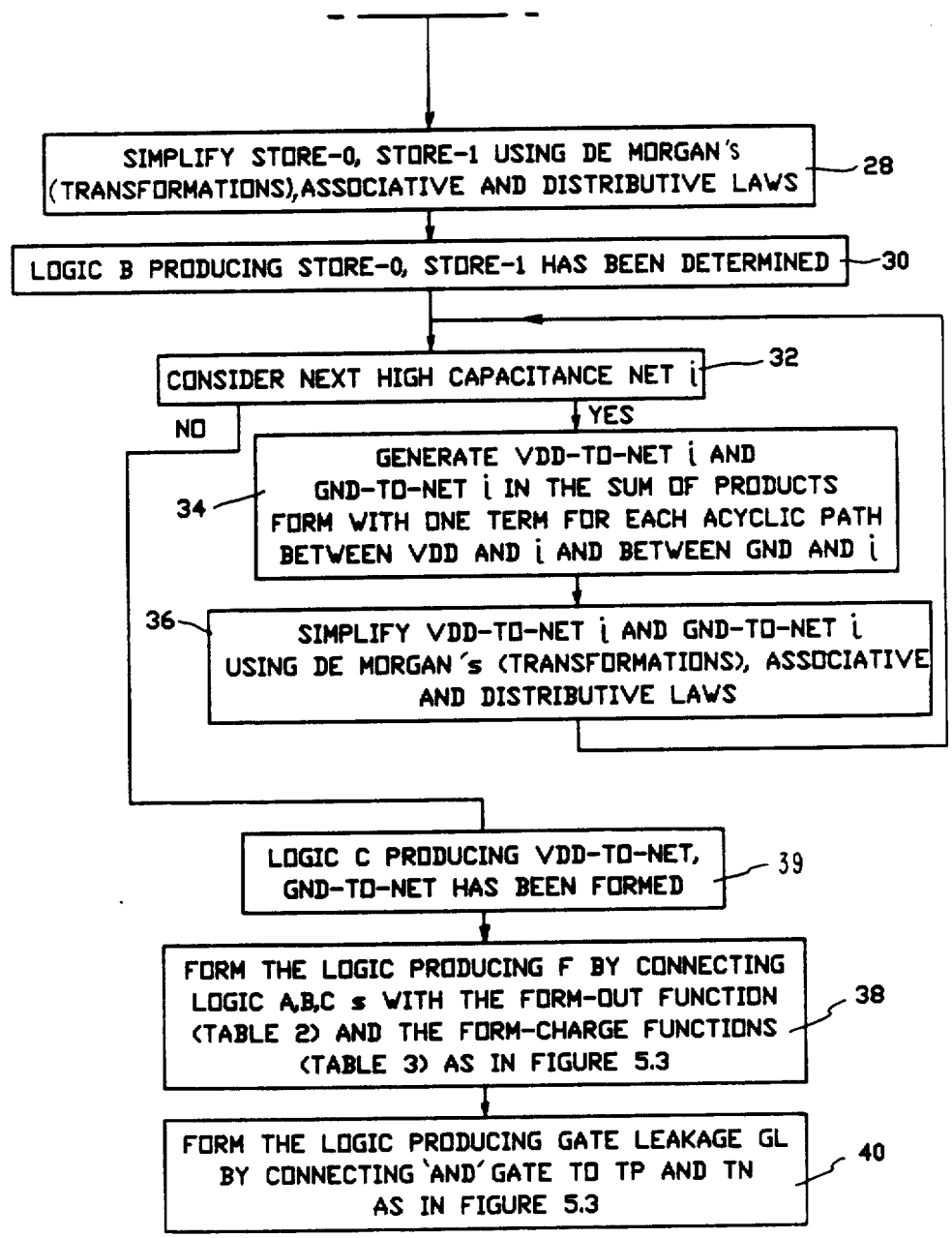
FIG. 6.3B

METHOD FOR THE MODELING AND FAULT SIMULATION OF COMPLEMENTARY METAL OXIDE SEMICONDUCTOR CIRCUITS

TECHNICAL FIELD

The present invention relates generally to the field of integrated circuit manufacture and testing. In particular, the invention relates to a method of representing complementary metal oxide semiconductor (CMOS) combinatorial circuits by Boolean gates, particularly for purposes of fault simulation and diagnostic testing.

BACKGROUND OF THE INVENTION

When integrated circuits are manufactured, there is a substantial probability that a particular chip will not function as designed. Because of many manufacturing variabilities, a given chip may not provide the correct outputs for a particular set of inputs. Such faults often occur randomly from one chip to the next, and may occur for any one or more of a great variety of reasons which will be understood by those skilled in the art. Accordingly, standard practice is to subject each chip to a number of test patterns and to measure the output for each one. A fault simulation approach to determine testability is described by Chao et al in U.S. Pat. No. 3,775,598. Fault simulation requires a logical model of the integrated circuit and possible faults are then inserted into the model, corresponding to possible faults in the real chip.

There are various levels of abstraction for the circuit model that can be used in the fault simulation. A general description of simulators of different levels is contained in a technical article entitled "A System Engineer's Guide to Simulators" by Werner et al appearing in VLSI Design, February 1984, pp. 27–31. One type is described by Timoc in U.S. Pat. No. 4,308,616 who adds a fault inserter to physical circuits.

Perhaps the conceptually simplest for CMOS is the switch level. The switch-level representation of a circuit is an interconnection of transistors and the like. Faults are fairly easily inserted into the switch level representation. However, once all the transistors are interconnected according to the design of the chip, the result is a very complex, nonlinear circuit. Such a switch level circuit is difficult to evaluate for the relation of inputs to outputs.

Another type of representation is a Boolean model in which Boolean gates, such as AND or OR gates, are used. A Boolean circuit is much easier to evaluate mathematically. The Boolean model may be more complex than the corresponding switch-level model, but once the model has been set up, sophisticated and efficient computer simulators are available.

Many bipolar circuit elements can be readily converted to Boolean equivalents. However, MOS circuit elements are much more difficult to transform to a Boolean representation with the proper simulation of MOS faults.

One recently developed type of MOS circuits is a differential cascode voltage switch (DCVS). This type of circuit is disclosed by Heller et al in a technical article entitled "Cascode Voltage Switch Logic Family" appearing in Proceedings of IEEE International Solid-State Circuits Conference, Feb. 22–24, 1984, San Francisco, Calif. This type of circuit is also described in patent application, Ser. No. 554,146 filed Nov. 21, 1983 by W. R. Griffin et al.

A method for the "Fault Simulation for Differential Cascode Voltage Switches" is set forth and described in U.S. patent application, Ser. No. 709,612, filed Mar. 8, 1985 and assigned to the same assignee as the present invention. The fault simulation method described in this application has essentially the same objective as the present invention but deals with a different class of circuits. The present invention deals with static CMOS circuits designed from book sets.

With static CMOS circuits there are hazards (or "glitches") and charge sharing effects that introduce problems which are not present in DCVS circuits. It is, however, absolutely necessary for these effects to be considered to achieve an effective circuit model as will be apparent from the subsequent description.

The need for better methods of modeling and simulating is exacerbated in the case of circuit packages where a complete circuit is designed with a large plurality of predesigned individual circuits which perform various logic functions which might include ANDs, ORs, EXCLUSIVE ORs, NANDs, NORs, inverters, multiplexors, etc. These circuits are designed from a large catalog of interconnectable functional elements. Such catalogs are known in the art by various names such as master images, master slices, book sets, gate arrays, standard cells, etc.

In the present application catalogs are referred to as book sets and the individual combinatorial circuits contained thereon are referred to as books.

There is a great need in the industry to provide a means for accurately modeling the overall circuit and, utilizing these models, to develop an accurate simulator which may be used for purposes of testing the design or, as described subsequently, for testing the effectiveness of the diagnostic patterns which are to be utilized for purposes of testing the operability of the chips produced.

CMOS is considered the future technology for a wide variety of products in the electronic industry. An important part of any design system, and in particular a design system for a new CMOS technology, is the support provided for testability analysis.

In the following portions of the specification numerous references are made to additional prior art publications and patents. These are located in the single Bibliography listing at the end of the specification in ascending order by year of publication and may be readily accessed from the reference codes utilized.

The incompleteness of the classical stuck-at fault models for CMOS is now well recognized [GAL80, WAD78]. The fault models proposed for CMOS include transistor stuck nonconducting and stuck conducting faults, as well as shorts and opens in connections, in addition to the classical stuck-at faults described in [ELZ81, CHI83, JAI83]. In static CMOS the generation of test sequences for sequential faults is further complicated by effects of stray delays. This was first introduced in [RED83], where the invalidation of test sequences due to stray delays is analyzed. Some of the concepts that have been developed on hazards which are relevant to the present invention will now be discussed.

A combinational logic network contains a (static) hazard for an input change involving the changing of one or more input variables if and only if (1) the output before the change is equal to the output after the change and (2) during the change a spurious pulse may appear at the output [EIC65].

Consider two input states A and B. The transition subcube T(A,B) is the set of all states that are identical to A and B in the input variables in which A and B agree. T(A,B) is the set of all points (input states) that may be passed through during a transition between A and B. This assumes that the variables change in any order and that variables with constant values do not bounce around [FRI75].

There are two types of hazards: Function hazards and Logic hazards.

A function F is said to have a function hazard for the input change A→B if F(A)=F(B) and there exists some input state C contained in T(A,B) such that F(C)≠F(A) [FRI75]. Function hazards are inherent in the function and cannot be removed by implementation changes.

If for the input change A→B there is no function hazard, but a particular realization can produce a spurious pulse during the input change, for some distribution of stray delays (delays in logic elements and in the wiring), the realization is said to contain a logic hazard. This kind of hazard may be removed by modifications to the implementation.

A combinational circuit realizing a function F has a 0-hazard (1-hazard) for transition from input $I_1$ to $I_2$ if:
1. $F(I_1) = F(I_2) = 0$ (1), and
2. A 1-pulse (0-pulse) may appear (depending on stray-delay values) during the transition $I_1 \rightarrow I_2$.

When modeling hazards in CMOS books the first question that needs to be answered is why it is necessary to be concerned with hazards. Circuit designers are aware of their existence and have designed the logic so that it performs the correct function in their presence. Also, synchronous sequential circuit design techniques have been used in many technologies successfully. The problem is that hazards affect the behavior of defective circuits and, hence, have to be considered. The fault simulator that is used to evaluate coverage of some fault model by a given test set has to model the circuit behavior correctly. In CMOS, a fault can transform a combinational circuit into a sequential one. To detect such faults a sequence of two test patterns is required. The first test pattern is used as a setup by charging or discharging a net in both the faultless and faulty circuits. The presence of a glitch could destroy the setup performed by the first pattern and, thus, invalidate the test sequence [RED83]. (The term 'glitch' as used hereinafter, refers to an error condition resulting from a hazard.) The approach taken here is a conservative one: the fault simulator will mark off a fault as being detected by a test set if and only if no combination of stray delays can invalidate the test.

The structure of a CMOS gate is shown in FIG. 1. There is an nFET network and a pFET network connected together to produce the output signal F. A book in a CMOS library may be a CMOS gate or an interconnection of a small number of CMOS gates.

In order to illustrate the effect of hazards, first consider the following scenario: The CMOS gate 2 in FIG. 2 is faulty. To test this fault two patterns P1, P2 are applied to gate 2 in sequence. The change P1→P2 involves only one input variable change to gate 2. However, a hazard in gate 1 could cause a glitch on input k to gate 2 that is supposed to remain constant. This glitch could invalidate the setup performed by pattern P1. The simulator needs to model the behavior of both the faultless and faulty gates correctly with respect to both function and logic hazards.

In the following description of the invention a general method for modeling complex CMOS gates is explained. The general method produces an accurate model which takes into account the static hazards present in the circuit, as well as charge storing nets which can similarly lead to inaccurate models if they are not taken into account.

DESCRIPTION OF THE PRIOR ART

The following is a detailed discussion of a number of additional prior art patent and literature references relevant to the present invention. As stated previously, the numbers in brackets refer to the bibliography at the end of the specification. Several of these references have already been discussed in the Background of the Invention section.

It is well known that sequential circuits (including combinatorial circuits that have sequential behavior because of defects) often require pairs of test patterns applied in sequence (hereafter referred to as "test pairs"). It is also well known that hazards and races in the circuit design may cause the response to a test pair to depend on details of the timing of transitions between logic values at the circuit inputs, and on details of internal timing. Because these details are not controllable, it is important to identify the circuit outputs with such timing dependence for each test pair. Comparison of actual and expected values should be inhibited for these circuit outputs.

Heilweil and McMahon [HEI72] describe a technique for such identification and inhibition during testing. Chao et al [CHA73] describe a technique for such identification and inhibition during test coverage evaluation. Both techniques presuppose an accurate 3-valued simulation model. After simulating the circuit response to the first pattern in a test pair and before simulating the response to the second pattern, the value X is applied to each circuit input that will see a change from 0 to 1 or from 1 to 0. This intermediate simulation may cause the simulation of the second pattern to assign X to some circuit outputs, and such outputs are identified as timing dependent for the given test pair. (The X represents an indeterminate logic value.)

Neither Heilweil and McMahon ([HEI72]) nor Chao et al ([CHA73]) provide any 3-valued simulation capability. The present invention provides such a capability for designs using CMOS book sets.

Beaven and Brown [BEA78] present an approach to modeling of a high-impedance state in 2-valued logic simulators. This approach does not cover the case of faulty CMOS designs, since in the latter the state of a non-driven net depends on its previous state, and cannot be defined beforehand, as is the case of high-impedance in TTL circuits. The present invention provides for the accurate modeling of the memory properties of faulty CMOS circuits.

Cesar, Cha and Donath [CES79] disclose a procedure to efficiently fault simulate mixed, sequential and combinatorial, networks under certain design restrictions. Their fault model is inappropriate for CMOS faults. The present invention provides an accurate fault model for faulty CMOS books.

Goel [GOE78] deals with speeding up fault simulation in an LSSD design. This technique is inapplicable to CMOS designs, even if they are constrained to use the LSSD design rules, since it assumes that only logic which feeds active SRLs will need to be evaluated in order to determine the overall state of the circuit. The assumption here is that values which are not latched into SRLs will not affect the future state of a circuit. This assumption fails in the case of faulty CMOS circuits, since they "remember" previous states, even if they are not latched into SRLs. The present invention considers all memory states resulting from faulty CMOS books.

Whitney [WHI71] proposes manipulating Boolean equations, representing feedback-free circuits, to derive test vectors for gate-level networks. This approach is purely combinatorial and cannot handle CMOS faults. The present invention does not deal with test pattern generation, but rather with accurate fault simulation of CMOS circuits, which may be used as a vehicle for finding and/or validating test patterns.

Vogelsberg [VOG73] describes a technique for saving time in event-driven simulators. This does not provide any modeling or simulation capability; it does show how a given capability might be used more efficiently. The present invention provides such a capability for designs using CMOS book sets.

Hlavicka and Kottek [HLA76] study the suitability of the stuck-at fault model for TTL circuits and propose some extensions to cover other defects in this technology. This work is restricted to TTL circuits and does not include faults typical of CMOS technology. The present invention specifically addresses those faults typical of CMOS technology.

Al-Arian and Agrawal [ALA76] deal with the modeling and test generation of (NAND or NOR)-only CMOS circuits. Since these gates do not present charge sharing phenomena when faulty, as is the case with complex CMOS books made up of several gates, their model does not address this problem. Also, they do not take into account the possible effects of hazards in invalidating test pairs. The present invention handles both charge sharing and hazards in the modeling and simulation of CMOS books.

Jain and Agrawal [JAI85] consider MOS gates built from series-parallel networks of transistors. They include CMOS gates in which the output is connected to Vdd by a series-parallel network of pMOS transistors and to Ground by a series-parallel network of nMOS transistors. Modeling these gates with Boolean gates and an additional primitive at the output, they consider test generation. This work is restricted to series-parallel networks. Charge sharing is not considered at all. The problem of hazards is mentioned but not solved.

Reddy, Agrawal and Jain [RED84b] and Reddy, Reddy and Agrawal [RED84a] extend the work of Jain and Agrawal ([JAI85]) to a class of CMOS gates called "full CMOS". Hazards are modeled. Gates that are not full CMOS and are also not built with series-parallel networks can presumably be modeled by combining the various techniques of these three works ([JAI85], [RED84b], [RED84a]), but charge sharing is still not considered in any of them.

Fault simulation of test sequences for VLSI circuits designed from CMOS book sets could in principle be performed by a general switch level MOS simulator, such a FMOSSIM [BRY83]. In practice, such simulators are 100 to 1000 times too slow for simulating lengthy test sequences on large circuits. For circuits designed from CMOS book sets (in contrast with unrestricted custom MOS designs), the present invention obtains the same end results as switch level simulation of transistor-level faults. These end results are obtained by entirely different means that are efficient enough for practical use.

SUMMARY AND OBJECTS OF THE INVENTION

It is accordingly a primary object of the present invention to provide a method for producing a Boolean gate level model of both individual CMOS combinatorial circuits (hereinafter referred to as "books") and large integrated circuit designs comprising a large plurality of such books.

It is a further object to provide such a method taking into consideration problems important to CMOS combinatorial circuits including static hazards and charge storage effects due to high capacitance nets, which problems are not covered by conventional modeling procedures.

It is a further object to provide such a method wherein both faultless and faulty models are created for each book and combined in a unique manner for doing simulation tests.

It is yet another object of the invention to provide such a model wherein current leakage can be utilized as an additional test for faulty circuit performance.

It is a further object to produce such models for both faultless and faulty gates utilizing Boolean logic equations, and unique FORM-OUT and FORM-CHARGE functions which preserve both static hazard and charge storage effects in their outputs to accurately represent the performance of the circuit during various fault conditions to be sequentially introduced into the model for fault simulation purposes.

It is a still further object of the invention to provide a method for utilizing the models created for each book into a complete integrated circuit design package for simulating the operation and performance of the complete integrated circuit constructed of a plurality of such books and particularly for evaluating the effectiveness or completeness of the fault coverage of a particular set of diagnostic test patterns.

It is yet another object of the invention to provide such a method wherein, during the procedure to determine whether a particular test catches a particular fault, the faulty model is used only for the single book containing the fault in question. This procedure may be repeated for as many faults as desired.

The objects of the present invention are accomplished in general by a method for producing accurate models of book sets utilizing CMOS technology which incorporates the effect of charge sharing and potential static hazards. Boolean gate level logic models are derived for each book such that transistors stuck nonconducting and stuck conducting faults can be represented by stuck-at faults in the models. A set of unique functions is generated for each book in the book set from conventional data describing the Boolean function performed by the book, a description of individual transistor interconnectivity in the book, and the charge storage nets present. Utilizing this information a set of logical statements are produced for both faultless and faulty versions of each book. They are combined in the manner specified by the logical design of the circuit incorporating a plurality of such individual books to produce the overall circuit simulation.

Other objects, features and advantages of the invention will be apparent from the following description of the invention with reference to the drawings in which:

BRIEF DESCRIPTION OF THE DRAWINGS

FIG. 1 comprises a simplified functional block diagram of a basic CMOS gate.

FIG. 2 comprises a functional block diagram of two sequential faultless and faulty gates illustrating the effect of hazards on test pairs.

FIGS. 3.1, 3.2 and 3.3 comprise respectively a logical schematic diagram for a "2 input NAND gate", a contact network for the nFET, and pFET circuitry.

FIG. 4 comprises a logical schematic diagram of a CMOS "four (4) input AND-OR" combinatorial circuit.

FIGS. 5.1 and 5.2 comprise a functional representation for a faultless CMOS gate (A), one having substantial identical hazards in the pFET and nFET networks and (B) distinct non-symmetrical hazards in the pFET and nFET networks.

FIG. 5.3 comprises a block diagram structure of a model for a faulty CMOS gate. It is similar in layout to FIG. 5.2 clearly indicating the more complex conditions which must be considered for the "faulty" case.

FIG. 6.1 is a flow diagram of the steps involved in the method for constructing faulty gate level models all as taught by the present invention.

FIG. 6.2 comprises a detailed flow chart of the precedure for generating a faultless model as shown in the "Logic Model Generation" block of FIG. 6.1.

FIG. 6.3A and 6.3B comprise a detailed flow chart of the procedure for generating a faulty model as shown in the "Logic Model Generation" block of FIG. 6.1.

DESCRIPTION OF THE DISCLOSED EMBODIMENT OF THE INVENTION

Figure 7:
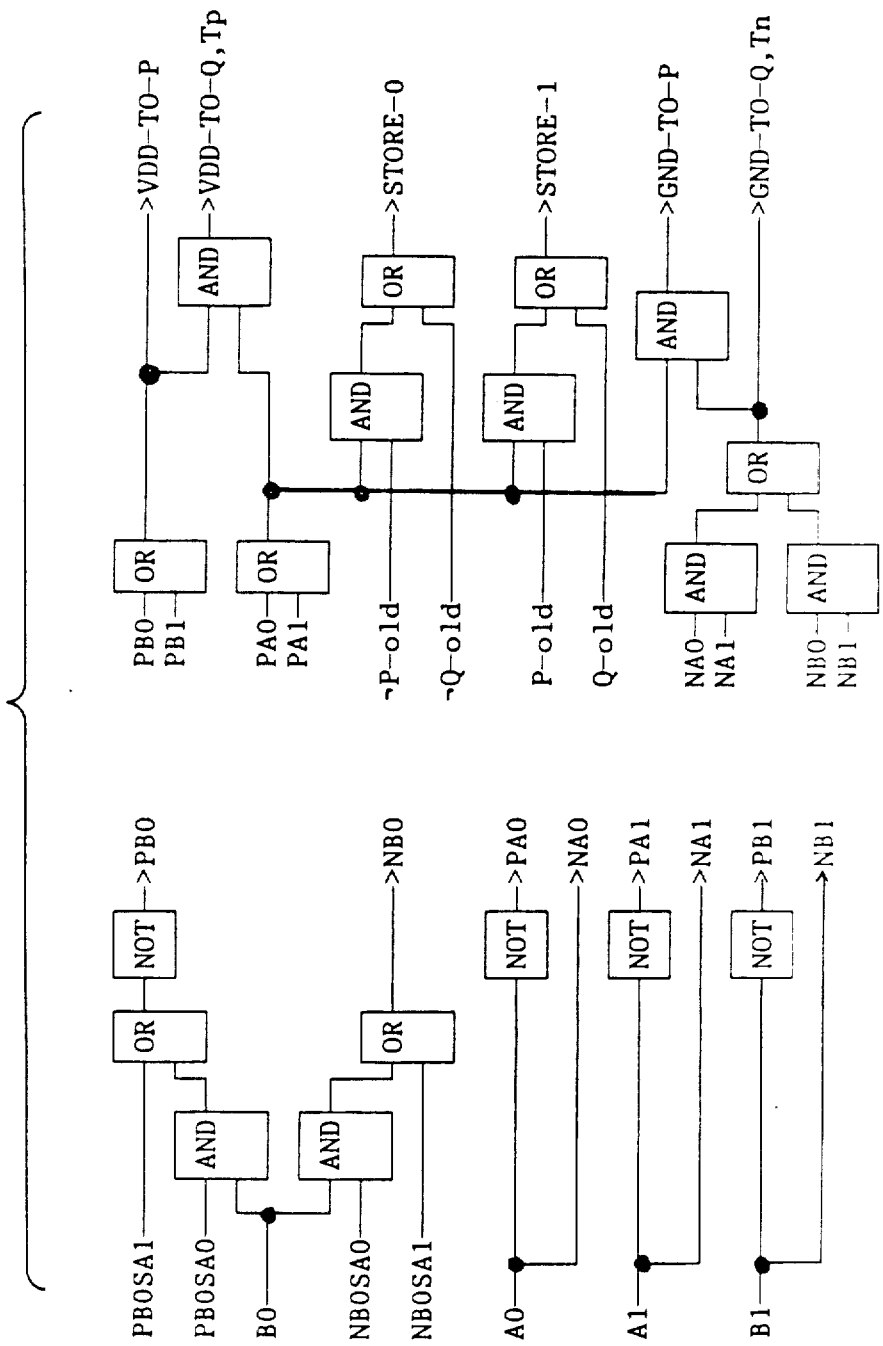
FIG. 7 comprises an example of the process shown in FIG. 5.3 for the 4 input AND-OR-INVERT gate in the book shown in FIG. 4.

Description of the Theoretical Basis for the Present Invention

In the subsequent description a detailed description of the underlying principles of the present invention's accurate modeling technique for for CMOS book sets to be used with a class of gate simulators is set forth.

The formalism utilized to arrive at models that accurately portray the effects of stray delays is developed. Also, the invalidation of test pairs due to charge sharing problems is analyzed in detail. How the sequential behavior caused by transistor stuck open faults is captured by the precise modeling technique of the present invention which includes both stray delays and charge sharing is set forth. Test results have indicated that both these factors strongly affect fault coverage.

The modeling of stray delays and charge sharing is discussed. How to incorporate accurate models in a fault simulator that is oriented towards stuck-at faults is analyzed. An example utilizing the present invention is also included.

Considering first either the pFET or the nFET network of the CMOS gate. The most suitable model is assumed to be two terminal contact networks (relay networks). Much of the work on contact networks was developed in D. A. Huffman, "The Design and Use of Hazard-free Switching Networks," J. ACM, Vol. 4, pp 47–62, (Jan. 1957) hereinafter referred to as [HUF57], E. J. McCluskey, "Introduction to the Theory of Switching Circuits," McGrawHill Book Company (1965), hereinafter referred to as [MCC65]. Also, a complete analysis of hazards for these networks can be found in S. H. Unger, "Asynchronous Sequential Switching Circuits," Robert E. Krieger Publishing Company, (1983), hereinafter referred to as [UNG83].

The method of analysis for hazards in contact networks proposed in [UNG83], is to generate an equivalent two level AND-OR logic model by generating a product term for every acyclic path in the network. Another approach is to generate a two level OR-AND logic model by generating a sum term for each cut set of the network graph. Lemmas 4.1 and 4.2 in [UNG83] can then be used to perform a hazard analysis of the equivalent logic network.

This method can be used to derive a model for the pFET network and another for the nFET network. There are two requirements on the model for a CMOS gate. The first is that the model correctly represent the Boolean function of the gate. The second is that any potential for glitches due to hazards be accurately represented. Since it is necessary to preserve the hazard behavior of the FET networks in the models derived, only hazard-preserving transformations can be applied to simplify the Boolean expressions describing these models. The distributive and associative laws and De-Morgans' law are all hazard-preserving [UNG83].

This leads to an interesting question. Is it always necessary to separately model both the pFET and nFET networks?. The answer is NO!

Lemma: If the pFET and nFET networks of a gate implement complementary functions and if there is a one-to-one correspondence between 1-hazards (0-hazards) of the pFET network and 0-hazards (1-hazards) of the nFET network, then one of them suffices to model the CMOS gate completely.

Some conventions will be next described which are necessary when considering the FET networks as contact networks. The literal controlling the contact corresponding to an nFET transistor will be the variable name connected to the gate of that transistor. For a pFET transistor the contact is controlled by the complement of the gate variable. This reflects the fact that n and p transistors conduct with the gate values 1 and 0, respectively. For example, consider the simple NAND gate in FIG. 3.1. The set of acyclic paths in the nFET contact network (FIG. 3.2) (denoted nPATHS) is $\{(A,B)\}$. The set of cutsets of the pFET contact network (FIG. 3.3) that put the two terminal nodes (VDD and output) in different parts (denoted pCUTS) is $\{(\neg A, \neg B)\}$. The transmission functions of nFET (Tn) and pFET (Tp) networks using nPATHS and pCUTS, can be written as follows:

$$Tn = A \times B \text{ (FIG. 3.2)}$$

$$Tp = (\neg A) + (\neg B) \text{ (FIG. 3.3)}$$

These functions are clearly complements of each other. Now consider the mapping, M, from elements of nPATHS to elements of pCUTS obtained by complementing the literals in pCUTS.

$$M: \text{nPATHS} \rightarrow \text{pCUTS}$$

such that for any path $(X1, X2, \ldots, Xn)$ in nPATHS $M(X1, X2, \ldots, Xn) = \{(\neg X1), (\neg X2), \ldots, (\neg Xn)\}$ For this simple example, the mapping M is one-to-one correspondence. CMOS gates that have this property will be considered in greater detail below, but first Lemma 4.6 on page 130 of [UNG83] is restated.

Lemma 4.6 of [UNG83]: The dual of a circuit (AND and OR gates are interchanged) realizes the dual function with dual hazards.

Consider a circuit C which has a static 1-hazard (0-hazard) for an I→J transition. Using the Lemma above, the dual circuit C' has a 0-hazard (1-hazard) for the transition I'→J' (where I' and J' are vectors obtained by complementing the components of I and J, respectively). Next, consider a circuit C'' which is C' with all the input literals complemented. Now, C'' has a 1-hazard (0-hazard) for the transition I→J if C has a 0-hazard (1-hazard) for the transition I→J.

Theorem: In a CMOS gate for which the mapping M from nPATHS to pCUTS is a one-to-one correspondence, the hazards in that CMOS gate can be accurately modeled by considering either the pFET or the nFET network.

Proof: The circuit model using the paths of the nFET, C, and the model using the cutsets of the pFET, C'' are duals with all the inputs complemented. From the discussion above it may be concluded that there is a one-to-one correspondence between the 1-hazards (0-hazards) of the pFET network and the 0-hazards (1-hazards) of the nFET network. M being a one-to-one correspondence also implies that the functions realized by pFET and nFET are complementary. Thus the complete behavior, including all hazards, of the faultless gate can be represented by either one (nFET or pFET network).

There is an important subclass of CMOS gates in the class of networks considered in the Theorem above. This is the subclass of gates that have dual, series-parallel pFET and nFET networks. Many combinational logic gates fall into this subclass. Hence, efficient models for these gates can be derived as described in the next section.

Once a hazard-preserving model is obtained, the effects of hazards are accurately simulated using ternary simulation, E. B. Eichelberger, "Hazard Detection in Combinational and Sequential Switching Circuits," IBM Journal of Research and Development, (March 1965), pp 90–99, hereinafter referred to as [EIC65]. The procedure from this reference may be summarized as follows. All signals have three values (0,1,X). The stray delays in the transition between consecutive input patterns, I and J, are modeled by simulating the CMOS model with an intermediate set of inputs I', for which the changing inputs are set to X, while the others retain their values.

During normal operation of a CMOS gate, the output net gets connected to either VDD or GROUND for each input pattern. Therefore, there is no need to consider the charge sharing properties of correctly functioning CMOS circuits. On the other hand, the presence of a fault may cause the output to depend on the charge being shared by a number of nets with comparable capacitance.

For example, consider the 4-input AND-OR book shown in FIG. 4. Assume transistor 1 is stuck nonconducting. To test for this fault, a pair of patterns is needed that first discharges the net Q and then attempts to charge it through transistor 1. Net values for a likely-looking pair are shown below, with "?" after values that may not be as expected from a simplistic analysis.

| Pattern # | A1 | A0 | B1 | B0 | P | Q | F |
|---|---|---|---|---|---|---|---|
| 1 | 1 | 1 | 0 | 0 | 1 | 0 | 1 |

| Pattern # | A1 | A0 | B1 | B0 | P | Q | F |
|---|---|---|---|---|---|---|---|
| 2 | 1 | 0 | 1 | 0 | 1? | 0? | 1? |

There are two problems with this pair of patterns. First, there is a function hazard that could charge net Q to a logic 1 and thus invalidate the test (if transistor 2 switches before transistor 3). This was discussed earlier. To bring out the second problem, assume that transistor 3 switches before transistor 2. If the capacitances of nets P and Q are such that their sharing charge results in a voltage on Q that is at or above the threshold of the inverting buffer in the book, the fault in question will not be detected by this pair of patterns. If the net Q fanned out to a number of other books its capacitance would be high enough to dominate the net capacitance of P. In this book, however, Q does not fan out to other books because of the inverting buffer. Also, depending on the relative sizes of the devices in the buffer, its threshold could be biased towards either VDD or GROUND, making the buffer more sensitive to some instances of charge sharing.

The modeling problem gets more complicated when the following set of input patterns to this book is considered:

| Pattern # | A1 | A0 | B1 | B0 | P | Q | F |
|---|---|---|---|---|---|---|---|
| 1 | 1 | 1 | 0 | 0 | 1 | 0 | 1 |
| 2 | 1 | 1 | 1 | 0 | 1 | 0 | 1 |
| 3 | 1 | 0 | 1 | 0 | 1? | 0? | 1? |

In this case the function hazard has been removed by making only single input changes. The more important question is whether the charge on net P has decayed enough by pattern 3 so that charge sharing does not result in a high enough voltage on net Q to be interpreted as a logic 1.

Continuing along these lines, what is the duration for which the charge can be assumed to exist and cause a different result due to charge sharing? It is also necessary to note that the normal time constants for the leakage may not be applicable here because of the defect which is being modeled as a transistor stuck open. It is important, as in the case of hazards, that the simulator yield a lower bound on the coverage by considering the invalidation of tests due to charge sharing. At the same time, it would be totally unreasonable to model the capacitances of each net in the gate as comparable to that of the output net of the gate, and also assume that charges remained on all these nets indefinitely. Therefore, some reliance on circuit analysis and/or designer input, is required to determine those nets for which the net capacitance may play a role in the faulty circuit behavior.

The approach taken in the present invention is to partition all nets into two classes. Nets in the first class have capacitances which are considered small enough to be ignored, even in conjunction with other nets in this class. The capacitance of the nets in the second class will be modeled explicitly for faulty gates.

How the explicit net capacitances will be handled in the simulation model will now be described in detail. The model for the book containing the faulty transistor is explained using the example of FIG. 4. This book actually consists of 2 CMOS gates, an AND-OR-INVERT and an INVERTER. For the AND-OR- INVERT gate, P and Q are the only nets that have large enough capacitances to need explicit modeling.

It will be assumed that the charge on any of the nets, P and Q can be guaranteed to remain for one cycle when the net is isolated from both power supplies. Beyond one cycle the value is set to unknown (X) if the net continues to be isolated, irrespective of its original value (0 or 1). This symmetric behavior of isolated nets with value 0 or 1 may not be true for all CMOS technologies. For a particular technology the model can be changed to reflect, say, that a discharged net in isolation can be assumed to remain at logic 0 forever, whereas an isolated net at logic 1 can be assumed to hold its charge only for one cycle. How to model the symmetric case and where the changes would have to be made to model the asymmetric cases will now be explained. The choice of the more appropriate model will have to be made using more information about the leakage mechanisms in any particular technology.

Having described the underlying analytical philosophy of the present invention, there will now follow a precise description of the present method of designing a model which correctly represents the operation of CMOS gate circuits which accurately represents the operation of the circuits where static hazards and charge sharing phenomena are found to exist.

Description of the Disclosed Method for Generating Models of Individual Gates

The invention can be partitioned into two procedures. In the first an accurate model for each CMOS gatetype is constructed, and in the second the accurate models are used to evaluate the fault coverage of a design built using these CMOS gates. It should be understood that a given book may include a plurality of individual gates (blocks) and then each gate may itself be a complex transistor logic circuit.

Procedure 1

As stated previously, the structure of a CMOS gate is shown in FIG. 1. There is an nFET network and a pFET network connected together to produce the output signal F. For each CMOS gate, the transistor interconnectivity information is extracted from the SHAPES description of the gate. A typical formalism for the SHAPES description is CIF as described in Chapter 4 of [MEA80]. This is given as an example of a language used in the description of the geometrical shapes defining digital integrated circuits. This language and form are well known in the art and are not part of the present invention. Also generated is a list of the high capacitance nets in each gate. The extraction of interconnectivity and capacitance information is done with standard techniques, such as described in [GUP83], [TRI83].

These are given as examples of programs to extract the interconnectivity. From the geometrical shapes and the electrical layer description of the integrated circuit, the higher level description in terms of transistors and their interconnectivity can be extracted. As stated above these procedures are well known in the art and are not per se a part of the present invention.

These operations are performed in blocks 10, 12 and 14 of FIG. 6.1 and comprise known techniques well understood by those skilled in the art (prior art).

For each CMOS gate two Boolean gate level models are constructed, one for the faultless and one for the faulty CMOS gate.

These operations are shown as blocks 16 and 18 in FIG. 6.1 and are detailed in FIGS. 6.2 and 6.3. In the following description of the construction of the 'faultless' and 'faulty' models of FIGS. 5.1 through 5.3, figure and block references are included parenthetically to indicate the exact operations which are effected by the present modeling procedure. By first understanding the nature of the operations used in creating each model (of a logic gate) as represented functionally in FIGS. 5.1 through 5.3, the specific steps of FIGS. 6.1 through 6.3 will be apparent.

The present invention introduces two new terms referred to herein as FORM-OUT and FORM-CHARGE. The FORM-OUT and FORM-CHARGE functions are the two primary elements comprising the essence of the present invention. It is the application of these functions which produce the requisite model for both the faulty and faultless gates.

The faultless model has to preserve the logic function of the CMOS gate and the static hazards in the pFET and nFET networks. (FIG. 6.2 blocks) The faultless model when the pFET and nFET networks contain distinct hazards is shown in FIGS. 5.1 and 5.2. The function SIMPLE-FORM-OUT is defined in Table 1. It is a simple version of the FORM-OUT function needed for the faulty gate. The inputs to the function SIMPLE-FORM-OUT are defined as follows:

Tp: A value of 1 on this input indicates a conducting path from VDD to the output net for the current inputs to the gate. (FIG. 6.2, blocks 12 and 20)

Tn: A value of 1 on this input indicates a conducting path from GROUND to the output net for the current inputs to the gate. (FIG. 6.2, block 26 and FIG. 6.3, block 14)

F-old: This is the previous state of the output F.

The means for producing Tp, Tn are actually a set of particular Boolean logic equations representing the particular gate being modeled and are derived from the transistor interconnectivity as will be described below.

The structure of a model for the faultless CMOS gate is shown in FIGS. 5.1 and 5.2. The usual case is shown in FIG. 5.1. (FIG. 6.2 block 10) In most cases the two networks, pFET and nFET, contain identical hazards and thus exhibit the same hazard behavior. In such cases the faultless model can be further simplified as F being identically equal to Tp. In these cases the functions SIMPLE-FORM-OUT, Tn, and F-old are not required to compute F. This is illustrated in FIG. 5.1, where function F is identically Tp. FIG. 5.2 shows the model for the exceptions to this, namely, those gates that have distinct hazards in the pFET and nFET networks. The block entitled MEMORY is attributable to charge storage nets which will also be described later.

The following is an explanation of how the equations for producing Tp and Tn are derived (FIG. 6.2 blocks 12, 20 and 26). The networks of combinational logic marked Logic D and Logic E in FIGS. 5.1 and 5.2 produce the outputs Tp and Tn which were defined earlier. The inputs to these networks are the logical inputs to the CMOS gate being modeled. The equations defining the combinational logic in D and E to produce Tp are derived by considering all acyclic paths in the pFET network between VDD and the output net. The existence of these paths is determined by the value of the input variables to the CMOS gate and hence these equations are also in terms of the inputs to the CMOS gate. The derived equations are simplified using only the hazard preserving transformations (FIG. 6.2 block 14 and block 22 and block 30). The set of such hazard preserving transformations can be found described in [UNG83]. The hazard preserving transformations described in [UNG83] are the DeMorgan transformations of the form $$\neg(A \cdot B) = (\neg A) + (\neg B),$$

and $\neg(A+B) = (\neg A) \cdot (\neg B)$, the associative laws $$A + (B+C) = (A+B) + C \text{ and}$$

$$A \cdot (B \cdot C) = (A \cdot B) \cdot C;$$

and the distributive laws $$A \cdot (B+C) = A \cdot B + A \cdot C.$$

These transformations are themselves well known in logic design for reorganizing or simplifying logic operations. (FIG. 6.2 blocks 16 and 24 and FIG. 6.3 blocks 12 and 28). By only using the hazard preserving transformations the logic in D and E is simplified without any loss of information of the hazards contained in the actual pFET and nFET networks of the CMOS gate.

Referring to FIG. 5.2 specifically and logic E, this network produces Tp as does logic D in FIG. 5.1. But it must also produce Tn. This is done in exactly the same way as for Tp but in this case all acyclic paths in the nFET network between GND and the output net are considered (FIG. 6.3 block 16).

TABLE 1

| INPUTS | | | | OUTPUTS | |
|---|---|---|---|---|---|
| Tp | Tn | CHANGIN | F-old | F | F-stored |
| 1 | 0 | — | — | 1 | 1 |
| 0 | 1 | — | — | 0 | 0 |
| 1 | 1 | — | — | X | X |
| 0 | 0 | 0 | 0 | 0 | X |
| 0 | 0 | 0 | 1 | 1 | X |
| 0 | 0 | 1 | 0 | 0 | 0 |
| 0 | 0 | 1 | 1 | 1 | 1 |

The truth table of SIMPLE-FORM-OUT for input values in the binary domain (SIMPLE-FORM-OUT$_2$) is given in Table 1 wherein "-" means "don't care". Completion of the truth table of SIMPLE-FORM-OUT for ternary inputs (SIMPLE-FORM-OUT$_3$) is defined as follows: For any ternary input vector I, the set of binary inputs I may be formed by considering all combinations of 1s and 0s in those position in I that are X. Then, $$\text{SIMPLE-FORM-OUT}_3(I) = \begin{cases} b & \text{if some } b \text{ in} \\ & \{0,1\} \text{ has} \\ & \text{SIMPLE-FORM-OUT}_2 \\ & (I) = b \\ & \text{for all } I \text{ in } I. \\ X & \text{otherwise} \end{cases}$$

This operation is shown in block 34 of FIG. 6.2 which also utilizes the relationships specified in Table.

The structure of the model for a faulty CMOS gate is shown in FIG. 5.3. and the method for producing the model is shown in FIG. 6.3. LOGIC A, LOGIC B and LOGIC C comprise Boolean logic equations describing various paths in the pFET and nFET networks. (These combinational networks may share logic for efficiency reasons.) For each high capacitance net there is a submodel of the form shown below, the heavy dashed line, and this submodel has LOGIC C determined by the paths involving this net. The inputs to LOGIC B come from all the submodels for high capacitance nets.

The FORM-OUT function evaluates the output (F) of the gate. The FORM-CHARGE functions evaluates the stored charge (for the next cycle) on each high capacitance net. There will be as many FORM-CHARGE functions as there are high capacitance nets in the gate.

The output GATE-LEAKAGE indicates that both the pFET and nFET networks are conducting simultaneously and indicates a short circuit between VDD and GND. This information can be used, as described later, to determine coverage of transistor stuck-conducting faults.

The function FORM-OUT which evaluates the gate output (F) will be described first. The inputs to this function will now be described.

The inputs Tp and Tn have been defined earlier (utilized in FIG. 6.3 block 10).

The equations in logic block A to produce Tp and Tn are produced in the same way as described above relative to Logic E for the faultless model. Thus Logic A is the same as Logic E in FIG. 5.2.

STORE-0: The equation for STORE-0 is derived in Logic B as a sum of products expression with one product term corresponding to each high capacitance net in the CMOS gate in question (FIG. 6.3 blocks 22, 24). Note that this includes the output net itself since it is always considered a high capacitance net. The product term (PO(i)) for a single high capacitance net i is given by:

$$PO(i) = \neg \text{NET-OLD}(i) \text{ and PATH}(i, \text{output net})$$

where NET-OLD is the output of the MEMORY block attached to the FORM-CHARGE function (see FIG. 5.3) corresponding to high capacitance net i, and PATH(i, output net) represent the Boolean expression enumerating all acyclic paths between net i and the output net.

Note that again the expression in PATH(i output net) is simplified with the constraint of only using hazard preserving Boolean transforms as described previously (FIG. 6.3 blocks 24 and 28). Also, the expression for the case when the high capacitance net is the output net itself is PATH(output net, output net) = logic 1 (true). With this definition of STORE-0, it is a 0 when all the high capacitance nets with possibly conducting paths to the output net have the stored value (as given by NET-OLD(i)) of logic 1.

STORE-1: The equation for STORE-1 is derived also in Logic B as a sum of products expression with one product term corresponding to each high capacitance net in the CMOS gate in question (as for STORE-0). Note that this also includes the output net itself since it is always considered a high capacitance net (FIG. 6.3 block 24). The product term (P1(i)) for a high capacitance net i is given by:

$$P1(i) = \text{NET-OLD}(i) \text{ and PATH}(i, \text{output net})$$

where NET-OLD is the output of the memory element attached to the FORM-CHARGE function corresponding to high capacitance net i, and PATH(i, output net) represent the Boolean expression enumerating all acyclic paths between net i and the output net.

Note that again the expression in PATH(i, output net) is simplified with the constraint of only using hazard preserving Boolean transforms as described previously with reference to [UNG83]. Also, the expression for the case when the high capacitance net is the output net itself is PATH(output net, output net)=logic 1 (true). With this definition of STORE-1, it is a 0 when all the high capacitance nets with possibly conducting paths to the output net have the stored value (as given by NET-OLD(i)) of logic 0. It should be noted that STORE-0 and STORE-1 cannot be a logical 0 at the same time.

The truth table of FORM-OUT for input values in the binary domain (FORM-OUT2) is given in Table 2 wherein "-" means "don't care" (used in FIG. 6.3 block 38). Completion of the truth table of FORM-OUT for ternary inputs (FORM-OUT3) is defined as follows: For any ternary input vector I, the set of binary inputs I may be formed by considering all combinations of 1s and 0s in those positions in I that are X. Then, $$\text{FORM-OUT}_3 (I) = \begin{cases} b, & \text{if some } b \text{ in } [0,1] \text{ has} \\ & \text{FORM-OUT}_2 (I) = b \text{ for all } I \\ & \text{in } I. \\ X, & \text{otherwise} \end{cases}$$

TABLE 2

| Inputs | | | | Output |
|---|---|---|---|---|
| Tp | Tn | STORE-0 | STORE-1 | FORM-OUT |
| 1 | 0 | — | — | 1 |
| 0 | 1 | — | — | 0 |
| 1 | 1 | — | — | X |
| 0 | 0 | 0 | 0 | X |
| 0 | 0 | 0 | 1 | 0 |
| 0 | 0 | 1 | 0 | 1 |
| 0 | 0 | 1 | 1 | X |
| | | | | FORM-OUT2 |

The next function to be considered is FORM-CHARGE. This function evaluates the stored value of each net for the next cycle. The inputs to this function are defined below (FIG. 6.3 block 34).

VDD-TO-NET: This has value 1 if there is a conducting path from VDD to this net.

GND-TO-NET: This has value 1 if there is a conducting path from GROUND to this net.

The equations which define logic network C to produce the outputs VDD-TO-NET and GND-TO-NET are derived by considering all acyclic paths between VDD and the NET in question and all acyclic paths between GND and the NET, respectively. Again, only hazard preserving Boolean transforms are used to simplify these equations as described previously with reference to [UNG83].

CHANGIN: A value of 1 on this input indicates that the cycle currently being simulated is the transient input in the ternary simulation protocol. This information is used to prevent charge decay during these transient simulation cycles.

NET-OLD: This is the current state of the high capacitance net being considered. This is used to evaluate the state for the next cycle.

The truth table of this function for inputs in the binary domain is given in Table 3 (this data is used in conjunctin with Table 2 in FIG. 6.3 block 38). The extension to ternary inputs is carried out similarly to FORM-OUT.

$$\text{FORM-CHARGE}_3 (I) = \begin{cases} b, & \text{if some } b \text{ in } \{0,1\} \text{ has} \\ & \text{FORM-CHARGE}_2 (I) = b \text{ for} \\ & \text{all } I \text{ in } [I]. \\ X, & \text{otherwise} \end{cases}$$

TABLE 3

| INPUTS | | | | OUTPUT |
|---|---|---|---|---|
| VDD-TO-NET | GND-TO-NET | CHANGIN | NET-OLD | FORM-CHARGE |
| 1 | 0 | — | — | 1 |
| 0 | 1 | — | — | 0 |
| 1 | 1 | — | — | X |
| 0 | 0 | 0 | 0 | X |
| 0 | 0 | 0 | 1 | X |
| 0 | 0 | 1 | 0 | 0 |
| 0 | 0 | 1 | 1 | 1 |

The block diagram of FIG. 5.3 thus represents an accurate model of the components for any faulty gate whereas FIGS. 5.1 and 5.2 represent the faultless model, which is greatly simplified with respect to the faulty model.

It will be apparent, of course, that the evaluation of a faulty gate must be carried out in the ternary domain where changing inputs must be considered, all as explained in [EIC65]. The essence of the procedure of evaluation in the ternary domain was described previously. (page 23, lines 7-14.)

The result of this method is a large Boolean network representing the behavior of each gate. The data input to the model is an input vector I having an output for each original input to the CMOS gate together with a constant input for each modeled fault within the gate. To insert a fault, the corresponding constant input is treated as stuck-at the complement of its normal constant value.

The faulty and faultless models for each gate are combined in a novel manner as set forth subsequently so that only one faulty model (for a single gate) is used at any one time in evaluating the complete design.

The subsequent description of the flow chart of FIG. 6.1 synopsizes the modeling method and shows at what point various operations must be performed Once the gates are determined for a given book set the logic models for these gates need to be generated. The flow chart of FIG. 6.1 shows the various steps in generating these logic models on a high level. FIGS. 6.2 and 6.3 (6.3A and 6.3B) comprise detailed flow charts showing how the 'faultless' and faulty models are generated using the logic functions shown in FIGS. 5.1 through 5.3. References to the various blocks of FIGS. 6.1 through 6.3 were included previously to indicate the nature of the operation.

Step 1: For each book, the transistor connectivity information is extracted from the SHAPES description of the book.

Step 2: The transistor graph of the book is partitioned into the component CMOS gates. Also generated is a list of the high capacitance nets in each gate.

Step 3: At this point each CMOS gate is handled separately. The transistor connectivity and the classification of nets based on capacitance is used as input to generate the logic model for the faulty gate. The model for the faultless gate is a subset of the model for the faulty gate (shown in FIG. 5.1 and 5.2). In order to produce these models, the various path equations introduced in the description of FIGS. 5.1 through 5.3 have to be generated.

For performance reasons, path segments can be grouped together in order to share logic describing them in logic networks A, B and C in FIG. 5.3. For example, any path from VDD to a net R in the nFET network can be expressed as the concatenation of the path segment from VDD to the output net and the segment from the output net to the net R. Note that the set of all paths from VDD to the output net is exactly Tp. Only the hazard-preserving Boolean transformations can be used to generate the logic model which as described previously is done in logic A, B and C.

FIG. 7 illustrates the results of this process for some of the faults in the 4 input AND-OR-INVERT gate in the book shown in FIG. 6.1. For simplicity, only the faults on transistors 1 and 6 are modeled.

Since the set of CMOS gates chosen are not the set of books in the book set, the design description has to be expanded to be in terms of gates prior to simulation.

Incorporating Accurate Models in a Fault Simulator

There are many ways to organize a hardware or software simulator. Under mild assumptions about the general organization, it is possible to incorporate accurate models in a fault simulator that is oriented toward stuck-at faults.

It is assumed that the design as simulated is represented as an interconnection of blocks of known types, each receiving inputs from (and delivering outputs to) other blocks. For a large CMOS circuit designed from a book set, each gate must be entirely contained in a block in order to eliminate the possible effects of transistor bidirectionality inside blocks. Blocks could be chosen to include several gates, for example by taking each use of a book to be a block. Reasons to prefer small blocks will soon emerge.

The design as a whole is simulated by simulating blocks. Each block is simulated by simulating a logic model for all blocks of the same type. Block types are not restricted to any narrow class of primitives. So long as the partitioning into blocks and the association of logic models with block types is explicit in the representation that drives the simulator, other aspects of simulator organization do not matter. Block simulations may be scheduled in various ways and may or may not proceed in parallel.

A design with thousands of blocks will only need dozens of logic models for block types, and stuck-at faults can readily be placed on block inputs or block outputs. But how are faults inside the blocks to be simulated? *Simulation of a faulty block must not interfere with simulation of faultless blocks of the same type.*

Two logic models can be associated with each block type. The faultless block model is the one usually used (except for the particular block or book being faulted). It is accurate enough to simulate a block's contribution to the behavior of the design as a whole, despite faults elsewhere. The faulty block model has additional inputs, each with a designated constant value (logic 0 or logic 1). When all the additional inputs have their constant values, the faulty block model behaves like the faultless one. When one of the additional inputs is stuck at the negation of the constant value, the faulty block model behaves like a block with an internal fault. Notice that for each internal fault that is to be simulated, one additional input to the faulty block model is needed.

When it is time to simulate a block that has an internal fault, the simulator pretends that the block has additional inputs beyond those really present in the design. These correspond to the additional inputs in the faulty block model. The additional inputs are tied to their default values, but one additional input is stuck at the negation of its default value by ordinary stuck-at fault insertion used in the simulator.

A faulty block model may be 10 to 100 times more complicated than the corresponding faultless block model. Fortunately, simulation of a thousand blocks of a given type will only need to use the faulty model for the faulty blocks. It is usual to simulate singly faulted designs. Even when this is accomplished by simulating several single faults at the same time, most of the block simulations are of faultless blocks.

By choosing gates rather than entire books as the blocks, the fraction of the design requiring a greatly expanded modeling is minimized. Only a faulty gate needs to be modeled by logic to incorporate charge sharing. Another advantage of gates as blocks is in the number of block types needed. The number of gate types needed to generate each book in a book set may be much smaller than the number of books.

The following synopsizes the present simulation and fault evaluation method.

1. The CMOS gates in the design are identified.
2. For each fault the gate being faulted is marked. The faulty model for that CMOS gate type will be invoked to simulate the gate being faulted. All other CMOS gates will be simulated by the faultless models.
3. The sequence of input patterns is applied to the model. The ternary simulation protocol is used. All signals have three values (0,1,X). The stray delays in the transition between consecutive input patterns, I and J, are modeled by simulating the CMOS model with an intermediate set of inputs I', for which the changing inputs are set to X, while the others retain their values. The value of CHANGIN is set to 0 during the simulation of I and J but to 1 during the simulating of I'.
4. If increases in the steady state leakage current due to transistor stuck-conducting faults can be measured on the tester, then the fault coverage due to this observation can also be evaluated. This is measured as the faults caught on an extra observation point 'LEAKAGE' which is the logical OR of all the individual gate leakages.

EXAMPLE

In this section the results of fault simulation on a test case, a CMOS macro which is a part of a floating point chip is described. The characteristics of the design are given below in Table 4. Referring to the table, under the column 'Number', these entries represent the number of blocks of each gate type.

TABLE 4

| NUMBER | PRIMITIVE |
|---|---|
| 34 | Inverter |
| 58 | NAND |
| 4 | OR-AND-INVERT |

TABLE 4-continued

| NUMBER | PRIMITIVE |
|---|---|
| 32 | AND-OR-INVERT |

The MACRO HAS:
INPUTS 192
OUTPUTS 6

The OR-AND-INVERT and AND-OR-INVERT blocks were both modeled with an internal net whose capacitance is comparable to that of the output net. Two classes of faults were simulated, transistor stuck nonconducting faults (CMOS open faults) and stuck faults (stuck at 0; stuck at 1) on the inputs and outputs of each CMOS gate. The input used to drive the simulations was generated using a random pattern generation technique.

Table 5 summarizes the coverage results for both classes of faults. These results are averages over a series of 6 experiments for each model.

By comparing the coverage for stuck-at faults with the results for Model 1 (the accurate model incorporating both hazard and charge sharing phenomena) it was noted that the stuck-at faults are uncovered well before the transistor open faults. Moreover, ignoring charge sharing effects (Model 2), or the invalidation of test patterns due to hazards (Model 3), or both (Model 4), does not change this relation.

On the other hand, ignoring either or both of these phenomena (i.e., charge sharing and hazards) leads to a consistently optimistic coverage, a dangerous prospect for testability analysis. Also, the use of test patterns as a diagnostic tool requires that the fault simulation be as accurate as possible. Of course the effect of ignoring charge sharing is small in the test case, but nearly two-thirds of the books have no opportunities for charge sharing in the first place. Those with opportunities have only one high capacitance net in addition to the output net. However, there is a definite demonstrable effect even in this relatively uncomplicated circuit. It will obviously be significantly greater with more complex circuits.

Based on limited testing, it has been observed that books containing several high capacitance nets (relative to the output net) result in a more marked difference between the results of the complete model than those of the less accurate ones. Also, the number of test patterns required for the full coverage of the transistor open faults may be as much as two orders of magnitude greater than that required for stuck-at faults in more naive gate level expansions of the CMOS circuit.

TABLE 5

| Number of random patterns | Stuck Faults | Transistor Open Faults | | | |
|---|---|---|---|---|---|
| | | Model 1 | Model 2 | Model 3 | Model 4 |
| 16 | 29.01 | 0 | 0 | 0 | 0 |
| 32 | 39.19 | 15.56 | 15.83 | 18.62 | 19.12 |
| 64 | 50.33 | 27.77 | 28.22 | 33.04 | 33.78 |
| 128 | 61.49 | 40.60 | 40.92 | 47.31 | 48.19 |
| 160 | 65.04 | 44.14 | 44.39 | 51.21 | 52.07 |
| 320 | 75.77 | 55.74 | 55.90 | 63.24 | 63.62 |
| 640 | 86.96 | 68.78 | 68.89 | 74.48 | 74.48 |
| 1280 | 92.51 | 77.45 | 77.45 | 81.98 | 81.98 |
| 1600 | 95.40 | 81.10 | 81.10 | 85.06 | 85.06 |
| 3200 | 98.12 | 86.39 | 86.39 | 90.09 | 90.09 |
| 6400 | 99.19 | 91.46 | 91.46 | 93.17 | 93.17 |
| 12800 | 99.86 | 95.87 | 95.87 | 96.28 | 96.28 |
| 16000 | *100* | 96.68 | 96.68 | 96.82 | 96.82 |
| 32000 | | 98.13 | 98.13 | 98.13 | 98.13 |
| 64000 | | 99.27 | 99.27 | 99.27 | 99.27 |
| 128000 | | 99.72 | 99.72 | 99.72 | 99.72 |
| 160000 | | 99.72 | 99.72 | 99.72 | 99.72 |
| 320000 | | *100* | *100* | *100* | *100* |

In Table 5, the fault coverage is shown in percentage (%) with random patterns of both transistor stuck closed and transistor stuck open faults for the example.

In this example, the following models were used:
Model 1—Complete model with charge sharing and hazards
Model 2—Only hazards modeled
Model 3—Only charge sharing modeled
Model 4—Neither charge sharing nor hazards modeled

CONCLUSIONS

A systematic method of generating very accurate logic gate models to describe the behavior of CMOS gates has been described. These models incorporate the correct behavior due to stray delays. A class of CMOS gates is identified from which the model sizes can be almost halved without any loss of accuracy. Also, the phenomenon of test sequence invalidation due to charge sharing in the faulty gates has been analyzed and incorporated into the model. The results of fault simulation of the example make it clear that both these factors need to be considered to accurately evaluate the testability of the CMOS circuit. The test case is a macro of moderate size with relatively little charge sharing, yet it clearly illustrates the difference between transistor open faults and a simplistic stuck fault model. For fault coverage percentages in the 90s, and more accurate model requires about 10 times as many random patterns to reach a given coverage goal. For diagnosis the accuracy of the model is even more crucial.

BIBLIOGRAPHY

[HUF57]D. A. Huffman, "The Design and Use of Hazard-free switching Networks," J.ACM, Vol. 4, pp. 47–62, January 1957.

[EIC65]E. B. Eichelberger, "Hazard Detection in Combinational and Sequential Switching Circuits," *IBM Journal of Research and Development,* March 1965, pp. 90–99.

[MCC65]E. J. McCluskey, *Introduction to the Theory of Switching Circuits,* McGraw-Hill Book Company, 1965.

WHI71]Whitney, G. E.: "Algebraic Fault Analysis for Constrained Combinational Networks," *IEEE Transactions on Computers,* Vol. C-20, No. 2 (February 1971), 141–145.

[HEI72]Heilwell, M. F., and McMahon, M. T. Jr.: "Testing of Nonlinear Circuits by Comparison with a Reference Simulation with Means to Eliminate Errors Caused by Critical Race Conditions," U.S. Pat. No. 3,633,100 (January 1972).

[CHA73]Chao, C. C., Lange, L. K., Lindbloom, E., and Savkar, A. D.: "Fault Simulation System for Determining the Testability of a Non-Linear Integrated Circuit by an Electrical Signal Test Pattern," U.S. Pat. No. 3,775,598 (November 1973).

[VOG73] Vogelsberg, R. E.: "Failure Activity Determination Technique in Fault Simulation," U.S. Pat. No. 3,715,573 (February 1973).

[FRI75] A. D. Friedman and P. R. Menon, *Theory and Design of Switching Circuits*, Computer Science Press, Inc., 1975.

[ALA76] Al-Arian, S. A., and Agrawal, D. P.: "Modeling and Testing of CMOS Circuits," *Proceedings of 1984 ICCD Conference* (October 1976), 763-769.

[HLA76] Hlavicka, J., and Kottek, E.: "Fault Model for TTL Circuits," *Digital Processes*, 2(1976), 169-180.

[BEA789 Beaven, P. A., and Brown, D. J.: "Simulation and Testing of Three-State Logic Circuitry," *IBM Technical Disclosure Bulletin*, Vol. 21, No. 4 (September 1978), 1662-1663.

[GOE78] Goel, P.: "Lookahead Technique for Speeding Up Fault Simulation for LSSD Logic Networks," *IBM Technical Disclosure Bulletin*, Vol. 21, No. 4 (September 1978), 1449-1450.

[CES79] Cesar, C. L., Cha, C. W., and Donath, W. E.: "Simultaneous Unit- and Zero-Delay-Mode Fault Simulation to Provide Decreasing Redundant Simulation of Gates in Arbitrary Sequential Circuits Fault Simulation," *IBM Technical Disclosure Bulletin*, Vol. 21, No. 10 (March 1979), 4269-4270.

MEA80] C. Mead and L. Conway, *Introduction to VLSI Systems*, Addison Wesley, 1980.

ELZ81] Y. M. El-Ziq, "Automatic Test Generation for Stuck Open Faults in CMOS VLSI," *Proc. ACM 18th Design Automation Conference*, June 1981, pp. 347-354.

BRY83] Bryant, R. E., and Schuster, M. D.: "Fault Simulation of MOS Digital Circuits," *VLSI Designs*, Vol. 4, No. 6 (October 1983), 24-30.

CHI83] K. W. Chiang and Z. G. Vranesic, "On Fault Detection in CMOS Logic Networks," *Proc. ACM IEEE 20th Design Automation Conference*, June 1983, pp. 50-56.

GUP83] A. Gupta, "ACE: A Circuit Extractor," Proc. of 20th Design Automation Conference, 1983.

[JAI83] S. K. Jain and V. D. Agrawal, "Test Generation for MOS Circuits Using D-Algorithm," *Proc. ACM IEEE 20th Design Automation Conference*, June 1983, pp. 64-70.

[RED83] S. M. Reddy, M. K. Reddy and J. G. Kuhl, "On Testable Design for CMOS Logic Circuits," *Proc. Internat. Test Conf.* 1983 (October 1983), pp. 435-445.

[TRI83] M. Trick, A. J. Strojwas, and S. W. Director, "Fast RC Simulation for VLSI interconnect," IEEE International Conference on Computer-aided Design, 1983, pp. 178-179.

[UNG83] S. H. Unger, *Asynchronous Sequential Switching Circuits*, Robert E. Krieger Publishing Company, 1983 (reprint).

[RED84a] S. M. Reddy, M. K. Reddy and V. D. Agrawal, "Robust Tests for Stuck-open Faults in CMOS Combinational Logic Circuits," *Proc. Fourteenth International Fault-Tolerant Computing Symposium*, June 1984, pp. 44-49.

[RED84b] S. M. Reddy, V. D. Agrawal and S. K. Jain, "A Gate Level Model for CMOS Combinational Logic Circuits," *Proc. ACM IEEE 21st Design Automation Conference*, June 1984, pp. 504-509.

[JAI85] Jain, S. K., and Agrawal, V. D.: "Modeling and Test Generation Algorithms for MOS Circuits," *IEEE Transactions on Computers*, Vol. C-34, No. 5 (May 1985), 426-433.

Having thus described our invention, what we claim as new, and desire to secure by Letters Patent is:

1. In a method operable on an electronic data processing system for generating Boolean gate level logic models of complementary metal oxide semiconductor circuits wherein the complete logic description of all of the transistors making up the CMOS circuit (to be modeled) specifying all logic functions and including the interconnectivity of the transistors is stored in machine readable form in system memory as a series of Boolean gate level descriptions and access to each individual CMOS gate making up said overall logic circuit description is available, the improvement which comprises a procedure for accurately representing the operation of the circuits to be modeled by considering all static hazard and charge storage effects inherent in the circuits in turn, utilizing Boolean logic equations to reflect a series of logic transformations in the gate level logic descriptions in accordance with a series of predetermined logic transformations and simplifications and including generating models for both faultless and faulty circuits and storing same in memory for use in analyzing the performance of the simulated CMOS circuits said procedure including a method for modeling a faultless CMOS gate circuit comprising both nFET and pFET networks wherein the nFET and pFET networks both contain identical static hazards, comprising generating a Boolean logic network for a function Tp derived from the combinatorial logic description of the circuit accessed from memory wherein the inputs to the network are the logical inputs to the circuit such that Tp is represented functionally as the output of an OR function, defining said OR function for Tp as having an input for each acyclic path from the circuit power source VDD to the CMOS gate's output net, such that said input is the output of an AND function with a complemented literal for each input to the CMOS gate that gates a transistor on said acyclic path from VDD, successively substituting in the resultant network only static hazard preserving transformations in the logic defining the circuit to simplify same, and representing the output F of the simulated circuit as being represented by the output of the generated logic circuit which produces Tp.

2. The improved modeling procedure as set forth in claim 1, said procedure further including a method for modeling a faultless CMOS logic comprising both nFET and pFET networks wherein the nFET and pFET networks each contain distinct static hazards, comprising generating a Boolean gate level network representation for the functions Tp and Tn, derived from the combinatorial logic description of the circuit accesed from memory such that Tp is the output of an OR function and Tn is the as the output of an OR function, specifying said OR function for Tp as having an input for each acylic path from the circuit power source VDD to the CMOS gate's output net, such that said input is the output of an AND function with a complemented literal for each input to the CMOS gate that gates a transistor on said acyclic path from VDD, specifying said OR function for TN as having an input for each acyclic path from GND to the CMOS gate's output net, such that said input is represented as the logical output of an AND function with a literal for each input of the CMOS gate that gates a transistor on said acyclic path from GND, successively substituting in the resultant network only hazard preserving transformations in the logic defining the circuit to simpilify same, combining the derived values for Tp and Tn into a SIMPLE-FORM-OUT function, having an output F, which is logically defined as a function of said Tp, Tn values and the value (F-old) of the immediately preceding output of the procedure when processing a previous input data pattern, wherein the SIMPLE-FORM-OUT function produces an output F in the binary domain and an output F-stored with inputs Tp, Tn, CHANGIN and f-old, as set forth in the following table for inputs with values 0 or 1:

| INPUTS | | | | OUTPUTS | |
|---|---|---|---|---|---|
| Tp | Tn | CHANGIN | F-old | F | F-stored |
| 1 | 0 | — | — | 1 | 1 |
| 0 | 1 | — | — | 0 | 0 |
| 1 | 1 | — | — | X | X |
| 0 | 0 | 0 | 0 | 0 | X |
| 0 | 0 | 0 | 1 | 1 | X |
| 0 | 0 | 1 | 0 | 0 | 0 |
| 0 | 0 | 1 | 1 | 1 | 1 | wherein "—" denotes "don't care" and "X" denotes an indeterminate logic value, and wherein SIMPLE-FORM-OUT is defined in the ternary domain for each of the 81 assignments of values (0 or 1 or X) to the inputs by means of the preceding table and the following rule;

whenever I is an assignment of values to the inputs of SIMPLE-FORM-OUT and (I) is the set of all assignments of binary (0 or 1) values to the inputs of SIMPLE-FORM-OUT that agree with I for each input assigned a binary value by I, then:

$$\text{SIMPLE-FORM-OUT } (I) = \begin{cases} b & \text{if some } b \text{ in } \{0,1\} \text{ has SIMPLE-FORM-OUT } (I) = b \text{ for all } I \text{ in } (I), \\ X & \text{otherwise.} \end{cases}$$

3. The improved modeling procedure as set forth in claim 2, said procedure further including a method for modelling a faulty CMOS logic gate having pFET and nFET networks therein comprising generating a first Boolean logic network representatiion (logic A) for the values Tp and Tn, as set forth previously wherein the nFET and pFET networks each contain distinct static hazards, generating a second Boolean logic network representation (Logic B) of a logic function having as inputs the input variables to the CMOS gate begin modelled and the charge stored during the previous operation of the CMOS gate (considering all potential charge storage nets in the CMOS gate) and producing an output function pair STORE-0, STORE-1 as a logical representation of a function comprising a sum of products expression with one product term corresponding to each high capacitance net (i) in the CMOS logic gate being modelled, which is derived from the logical description in system memory and wherein the product term PO (i) for a single high capacitance net is determined from the relationships:

PO(i)= ¬NET-OLD(i) and PATH(i, output net) where NET-OLD is the output of the MEMORY block attached to the output of the FORM-CHARGE function corresponding to high capacitance net (i) and PATH(i, output net) represents a Boolean expression enumerating all acyclic paths between NET(i) and the output net, generating as a logical representation of the function STORE-1 a sum of products expression with one product term corresponding to each high capacitance net in the CMOS logic gate being modelled which is derived from the logial description of the gate in system memory and wherein the product term (PI(i)) for a single high capacitance net is determined from the rlationships: PI(i)=NET-OLD(i) and PATH(i, output net) where NET-OLD(i) and PATH (i, output net) are as defined above for STORE-0, and successively substituting in the expression in the logical description of PATH(I, output net) only static hazard preserving transformations to simplify same, generating a third Boolean logic network representation (logic C) of a logic function having as inputs the input variables to the CMOS gate and the charge storing characteristics of a particular charge storage net in the circuit, producing a logical description of an output pair VDD-TO-NET and GND-TO-NET, and generating as many such third Boolean logic network representations as there are charge nets in the circuit, which comprises;

generating Boolean gate level logic equations considering all acyclic paths between the circuit power source VDD and the net(i) in the logic gate being modelled to produce a logical repesentation of the output VDD-TO-NET, generating Boolean gate level logic equations considering all acyclic paths between VDD and the net (i) in the logic gate being modelled to produce a logical representation of the output GND-TO-NET, and successively substituting in both sets of equations representing VDD-TO-NET and GND-TO-NET only static hazard preserving transforms to simplify same, representing the logical representations of a FORM-OUT functional block having as inputs the Tp and Tn outputs from the first Boolean network (logic A) and the STORE-0 and STORE-1 outputs from the second Boolean network (logic B) and producing an output function F which represents the output of the modelled gate, and wherein modelling the FORM-OUT function comprises, producing a logic representation of the output FORM-OUT$_2$ by logically combining the inputs Tp and Tn and STORE-0 and STORE-1, as defined in the following table for inputs with values 0 or 1:

| INPUTS | | | | OUTPUTS |
|---|---|---|---|---|
| Tp | Tn | STORE-0 | STORE-1 | FORM-OUT |
| 1 | 0 | — | — | 1 |

-continued

| INPUTS | | | | OUTPUTS |
|---|---|---|---|---|
| Tp | Tn | STORE-0 | STORE-1 | FORM-OUT |
| 0 | 1 | — | — | 0 |
| 1 | 1 | — | — | X |
| 0 | 0 | 0 | 0 | X |
| 0 | 0 | 1 | 0 | 0 |
| 0 | 0 | 0 | 1 | 1 |
| 0 | 0 | 1 | 1 | X | wherein "—" denotes "don't car" and "X" denotes an indeterminate logic value, and wherein FORM-OUT$_3$ is defined in the ternary domain for each of the 81 possible assignments of values (0 or 1 or X) to the inputs by means of the preceding table and the following rule; whenever I is an assignment of values to the inputs of FORM-OUT and (I) is the set of all assignments of binary (0 to 1) values to the inputs of FORM-OUT that agree with I for each input assigned a binary value by I, then:

$$\text{FORM-OUT}(I) = \begin{cases} b & \text{if some } b \text{ in } \{0,1\} \text{ has} \\ & \text{FORM-OUT}(I) = b \\ & \text{for all } I \text{ in } (I), \\ X & \text{otherwise,} \end{cases}$$

generating the logical representation of a FORM-CHARGE functional block having as inputs the VDD-TO-NET and GND-TO-NET outputs from the third Boolean network (logic C), an input NET-OLD which represents the previous output of the FORM-CHARGE block, and an input CHANGIN which indicates whether the cycle currently being simulated is the transient input in the ternary simulation protocol, said FORM-CHARGE block producing an output signal NET representing the charge storage phenomenon of hte particular net within the overall CMOS gate being modelled and wherein modelling the FORM-CHARGE$_2$ function comprises producing a logical representation of the output FORM-CHARGE$_2$ by logically combining the inputs VDD-TO-NET, CHANGIN and NET-OLD, as defined in the following table for inputs with values 0 or 1:

| INPUTS | | | | OUTPUTS |
|---|---|---|---|---|
| VDD-TO-NET | GND-TO-NET | CHANGIN | NET-OLD | FORM-CHARGE |
| 1 | 0 | — | — | 1 |
| 0 | 1 | — | — | 0 |
| 1 | 1 | — | — | X |
| 0 | 0 | 0 | 0 | X |
| 0 | 0 | 0 | 1 | X |
| 0 | 0 | 1 | 0 | 0 |
| 0 | 0 | 1 | 1 | 1 | wherein "—" denotes "don't care" and "X" deontes an indeterminate logic value, and wherein FORM-CHARGE$_3$ is defined for each of the 81 possible assignments of values (0 or 1 or X) to the inputs by means of the preceding table and the following rule; whenver I is an assignment of values to the inputs of FORM-CHARGE and (I) is the set of all assignments of binary (0 or 1) values to the inputs of FORM-CHARGE that agree with I for each input assigned a binary value by I, then:

$$\text{FORM-CHARGE}(I) = \begin{cases} b & \text{if some } b \text{ in } \{0,1\} \text{ has} \\ & \text{FORM-CHARGE}(I) = b \\ & \text{for all } I \text{ in } (I), \\ X & \text{otherwise,} \end{cases}$$

and logically combining the outputs Tp and Tn from the first Boolean logic network (A) in an AND function to produce an output (gate leakage) which when enabled, indicates a short circuit fault between VDO and GND through the CMOS gate being modelled.

4. The improved modelling procedure as set forth in claim 3, said procedure further including a method for evaluating the coverage of test patterns for testing the operation of the modelled complex CMOS logic circuits which comprises; accessing from memory both the faulty and faultless models generated for each of the CMOS gates which together form the overall CMOS circuit, simulating on the system the circuit to the tested by using the faultless models for all blocks assumed to be operating correctly, and using the faulty model for a block which is to be faulted and successively inserting single faults in the 'faulty' logical model of the circuit, using the faulty model for the CMOS gate containing the fault to be simulated and the faultless model for all other CMOS gates making up the circuit, running successive test patterns until either the fault has been detected or there are no more tests in the collection of tests being simulated, and marking the successful test pattern for subsequent use, proceeding to the next fault to be simulated, functionally inserting same in the 'faulty' model and continuing this procedure until all faults have been simulated in all of the gates making up the circuit and all successful test patterns have been marked, whereby all possible faults which can occur in the circuit are fully detectable by using only the marked test patterns.

5. In a method executable on an electronic data processing system for generating Boolean gate level logic models of complementary metal oxide semiconductor circuits wherein the complete logic description of all of the transistors making up CMOS circuit (to be modeled) specifying all logic functions and including the interconnectivity of the transistors is stored in machine readable form in system memroy as a seris of Boolean gate level descriptions, and access to each individual CMOS gate description making up said overall logic circuit description is available, the improvement which comprises a procedure for accurately representing the operation of the circuits to be modelled by considering all static hazards and charge storage effects inherent in the circuits, in turn, utilizing Boolean logic equations to reflect a series of logic transformations in the gate level logic description in accordance with the series of predetermined logic transformations and simplifications and including the generating models for both 'faultless' and 'faulty' circuits and storing same in memory for use in analyzing the performance of the simulated CMOS circuits said procedure including a first method for modelling faultless logical representations of each CMOS gate comprising the steps of Step 1—determining if the pFET and nFET networks contain identical hazards and if so proceeding to Step 2, if not proceeding to Step 6, Step 2—generating a logical representation of the funciton Tp in a sum of products form with one product term for each acycling path between the circuit power source VDD and the circuit output, Step 3—determining if the logical form of Tp can be further simplified and if so proceeding to Step 4, if not proceeding to Step 5, Step 4—applying Demorgan's Associative and Distributive laws to simplify the logical representation of the function Tp, and returning to Step 3, Step 5—producing an indication that a logic function (logic D) defined in Tp has been determined and exiting from the procedure, Step 6—generating a logical representation of the function Tp in a sum of products form with one product term for each acyclic path between the circuit power source VDD and output, and proceeding to Step 7, Step 7—determining if Tp can be simplified further and if so proceeding to Step 8, and if not proceeding to Step 9, Step 8—applying Demorgan's Associative and Distributive laws to further simplify the logical representation of the function Tp, and returning to Step 7, Step 9—generating Tn in the sum of products form with one product term for each acyclic path between GND OUTPUT, and proceeding to Step 10, Step 10—determining if the function Tn may be simplified further, and if so proceeding to Step 11 and if not proceeding to Step 12, Step 11—applying Demorgan's Associative and Distributive laws to simplify the current version of Tn and returning to Step 10, Step 12—logic E producing the logical representation of the functions Tp and Tn has been determined, proceed to Step 13, Step 13—forming the logic producing the function F utilizing the outputs Tp and Tn from logic E, simple 'change in' and 'memory' functions (F-old) as set forth in the following table defining Simple Form-Out,

| INPUTS | | | | OUTPUTS | |
|---|---|---|---|---|---|
| Tp | Tn | CHANGIN | F-old | F | F-stored |
| 1 | 0 | — | — | 1 | 1 |
| 0 | 1 | — | — | 0 | 0 |
| 1 | 1 | — | — | X | X |
| 0 | 0 | 0 | 0 | 0 | X |
| 0 | 0 | 0 | 1 | 1 | X |
| 0 | 0 | 1 | 0 | 0 | 0 |
| 0 | 0 | 1 | 1 | 1 | 1 | the procedure is ended.

6. The improved modelling procedure as set forth in claim 5, said procedure further including a method for modelling a 'faulty' CMOS logic gate having pFET and nFET networks therein comprising the steps of;

Step 1—generating a logical representation the function Tp in the sum of products form with one product term for each acyclic path circuit power source VDD and OUTPUT, and proceeding to Step 2, Step 2—applying Demorgan's associative and distributive laws to completely simplify the logical representation of Tp and proceeding to Step 3, Step 3—generating the function Tn in the sum of products form with one product term for each acyclic path between GND and OUTPUT, and proceding to Step 4, Step 4—applying Demorgan's Associative and Distributive laws to completely simplify the logical representation of Tn and proceeding to Step 5, Step 5—logic A, defining the logical representation of the functions Tp and Tn having been determined, store same in memory and proceeding to Step 6, Step 6—initializing the values STORE-0 and STORE-1 to, 'False' or a Boolean 0 and proceeding to Step 7, Step 7—determining if any more high capacitance nets in the gate being modeled have yet to be evaluated, and if so proceeding to Step 8, and if not proceeding to Step 10, Step 8—generating a logical representation of PATH (i, OUTPUT) in the sum of products form with one term for each acyclic path between i and OUTPUT, and proceeding to Step 9, Step 9—generating a logical representation of the functions (STORE-0 and STORE-1 from the functions generated in Step 8 in accordance with the following relationship:

STORE-0 = (STORE-0) OR {(⌐NET-OLD (i)) AND PATH (i, OUTPUT)}

STORE-1 = (STORE-1) OR {(NET-OLD (i)) AND PATH (i, OUTPUT)} return to Step 7,

Step 10—simplifying the logical representations for STORE-0 and STORE-1 using Demorgan's Associative and Distributive laws to replace complex terms until all possible simplifications have been performed, and proceeding to Step 11, Step 11—logic B producing the functions STORE-0 and STORE-1 having been determined store same in memory and proceed to Step 12, Step 12—determining if any more high capacitance nets, i must be evaluated and if so, proceeding to Step 13 and, if not, proceeding to Step 15, Step 13—generating a logical representation of the functions VDD-TO-NETi and GND-TO-NETi in the sum of products form with one term for each acyclic path between VDD and i and between GND and i and proceeding to Step 14, Step 14—simplifying the logical representation of the function VDD-TO-NET and GND-TO-NETi using Demorgan's associative and distributive laws to replace complex terms, and proceeding to Step 12, Step 15—the logical representation of the function logic C producing the functions VDD-TO-NET, and GND-TO-NET having been formed, store same in memory and proceeding to Step 16, Step 16—forming the logic producing the function F representing the Boolean gate level description of the 'faulty' CMOS gate by connecting the logic representations of the outputs of logics A, B, and C and FORM-CHARGE functions to produce the logial representation of the input to the FORM-OUT function in accordance with the relationships defined in the following table defining said FORM-OUT function:

|  | Inputs |  |  | Output |
| --- | --- | --- | --- | --- |
| Tp | Tn | STORE-0 | STORE-1 | FORM-OUT |
| 1 | 0 | — | — | 1 |
| 0 | 1 | — | — | 0 |
| 1 | 1 | — | — | X |
| 0 | 0 | 0 | 0 | X |
| 0 | 0 | 1 | 0 | 0 |
| 0 | 0 | 0 | 1 | 1 |
| 0 | 0 | 1 | 1 | X | and wherein the logical representation of FORM-CHARGE functions is defined in the following table:

| INPUTS | | | | OUTPUTS |
| --- | --- | --- | --- | --- |
| VDD-TO-NET | GND-TO-NET | CHANGIN | NET-OLD | FORM-CHARGE |
| 1 | 0 | — | — | 1 |
| 0 | 1 | — | — | 0 |
| 1 | 1 | — | — | X |
| 0 | 0 | 0 | 0 | X |
| 0 | 0 | 0 | 1 | X |
| 0 | 0 | 1 | 0 | 0 |
| 0 | 0 | 1 | 1 | 1 | and proceeding to Step 17.

Step 17—forming an additional logical output from the faulty circuit defining 'gate leakage' (GL) functionally by ANDing the outputs from the logical representations for the functions Tp and Tn whereby a dead short is indicated between VDD and GND in the logic gate under test, This completes the procedure.

* * * * *